(12) United States Patent
Lowrey et al.

(10) Patent No.: US 6,770,531 B2
(45) Date of Patent: Aug. 3, 2004

(54) ADHESIVE MATERIAL FOR PROGRAMMABLE DEVICE

(75) Inventors: Tyler A. Lowrey, San Jose, CA (US); Sean J. Lee, Santa Clara, CA (US); Huei-Min Ho, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 09/896,008

(22) Filed: Jun. 30, 2001

(65) Prior Publication Data

US 2003/0001242 A1 Jan. 2, 2003

(51) Int. Cl.[7] .............................................. H01L 21/336
(52) U.S. Cl. .................... 438/257; 438/180; 438/253; 438/300; 257/180; 257/355; 257/760
(58) Field of Search ................................ 438/253, 239, 438/241, 396, 300, 180; 257/128, 335, 760, 529, 355, 3

(56) References Cited

U.S. PATENT DOCUMENTS

| | | | | |
|---|---|---|---|---|
| 4,999,317 A | * | 3/1991 | Lu et al. ...................... 437/189 |
| 5,296,716 A | | 3/1994 | Ovshinsky et al. |
| 5,635,968 A | * | 6/1997 | Bhaskar et al. ............... 347/59 |
| 5,648,678 A | * | 7/1997 | Begley et al. .............. 257/529 |
| 5,789,758 A | | 8/1998 | Reinberg |
| 5,821,143 A | * | 10/1998 | Kim et al. ................... 438/267 |
| 5,879,955 A | | 3/1999 | Gonzalez et al. |
| 5,903,041 A | * | 5/1999 | La Fleur et al. ............ 257/530 |
| 5,920,788 A | | 7/1999 | Reinberg |
| 5,933,365 A | | 8/1999 | Klersy et al. |
| 5,970,336 A | | 10/1999 | Wolstenhome et al. |
| 5,998,244 A | | 12/1999 | Wolstenholme et al. |
| 6,002,140 A | | 12/1999 | Gonzalez et al. |
| 6,031,287 A | | 2/2000 | Harshfield |
| 6,031,827 A | | 2/2000 | Harshfield |
| 6,087,674 A | | 7/2000 | Ovshinsky et al. |
| 6,140,191 A | * | 10/2000 | Gardner et al. ............. 438/300 |
| 6,153,890 A | * | 11/2000 | Wolstenholme et al. ........ 257/3 |
| 6,184,081 B1 | * | 2/2001 | Jeng et al. ................... 438/253 |
| 6,229,157 B1 | | 5/2001 | Sandhu |
| 6,455,934 B1 | * | 9/2002 | Pasch .......................... 257/753 |
| 6,512,241 B1 | | 1/2003 | Lai |
| 2002/0080647 A1 | | 6/2002 | Chiang et al. |
| 2003/0001242 A1 | | 1/2003 | Lowrey et al. |
| 2003/0022420 A1 | * | 1/2003 | Kleveland et al. ........... 438/131 |
| 2003/0047727 A1 | | 3/2003 | Chiang |
| 2003/0052351 A1 | | 3/2003 | Xu et al. |
| 2003/0137869 A1 | * | 7/2003 | Kozicki ....................... 365/158 |

* cited by examiner

Primary Examiner—Matthew Smith
Assistant Examiner—Renzo Rocchegiani
(74) Attorney, Agent, or Firm—Anthony M. Martinez

(57) ABSTRACT

In an aspect, an apparatus is provided that sets and reprograms the state of programmable devices. In an aspect, a method is provided such that an adhesive is formed on a dielectric and on an electrode, the adhesive is patterned exposing the electrode, and a programmable material is formed on the adhesive and on the electrode. In an aspect, a method is provided such that an adhesive is formed on a dielectric, an opening is formed through the dielectric exposing a contact formed on a substrate, and a programmable material is formed on the adhesive and on a portion of the contact. A conductor is formed on the programmable material and the contact transmits to a signal line.

16 Claims, 22 Drawing Sheets

ADHESIVE MATERIAL FOR PROGRAMMABLE DEVICE

FIELD

Programmable devices, including phase change memory devices that can be programmed by modifying the state of a phase change material.

BACKGROUND

Typical computers, or computer related devices, include physical memory, usually referred to as main memory or random access memory (RAM). Generally, RAM is memory that is available to computer programs and read-only memory (ROM) is memory that is used, for example, to store programs that boot a computer and perform diagnostics. Typical memory applications include dynamic random access memory (DRAM), static random access memory (SRAM), erasable programmable read-only memory (EPROM), and electrically erasable programmable read-only memory (EEPROM).

Solid state memory devices typically employ microelectronic circuit elements for each memory bit (e.g., one to four transistors per bit) in memory applications. Since one or more electronic circuit elements are required for each memory bit, these devices may consume considerable chip "real estate" to store a bit of information, which limits the density of a memory chip. The primary "non-volatile" memory element of these devices, such as an EEPROM, typically employ a floating gate field effect transistor device that has limited re-programmability and which holds a charge on the gate of field effect transistor to store each memory bit. These classes of memory devices are also relatively slow to program.

Phase change memory devices use phase change materials, i.e., materials that can be electrically switched between a generally amorphous and a generally crystalline state, for electronic memory application. One type of memory element originally developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These electrical memory devices typically do not use field effect transistor devices as the memory storage element, but comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained until reprogrammed as that value represents a physical state of the material (e.g., crystalline or amorphous). Thus, phase change memory materials represent a significant improvement in non-volatile memory.

One characteristic common to solid state and phase change memory devices is limited reprogrammable cycle life from/to an amorphous and crystalline state. Further, over time the phase change material can fail to reliably reprogram from/to an amorphous and a crystalline state. Factors that contribute to these unfavorable characteristics include delamination of phase change materials due to stress of film depositions and heat, and intermixing of phase change materials with adhesion materials. It would be desirable to increase the programmable cycle life of the phase change memory material and avoid the above-stated factors.

BRIEF DESCRIPTION OF THE DRAWINGS

Advantages of the invention will become apparent upon reading the following detailed description and upon reference to the drawings, in which.

DETAILED DESCRIPTION

Exemplary embodiments are described with reference to specific configurations. Those of ordinary skill in the art will appreciate that various changes and modifications can be made while remaining within the scope of the appended claims. Additionally, well-known elements, devices, components, circuits, process steps and the like may not be set forth in detail in order to avoid obscuring the invention.

Currently, in some memory devices, an adhesive is not utilized between the phase change material and the electrode due to, in part, the impact that the adhesive has on the device. However, without an adhesive, the temperatures utilized in processing of memory devices is limited since temperature effects adhesion (e.g., delamination) between the phase change material and at least one of the electrode and the dielectric. Further, without an adhesive, the thickness of thin film deposition is limited since subsequent film depositions add stress, potentially causing delamination between the phase change material and at least one of the electrode and the dielectric.

Currently, in other memory devices, an adhesive is utilized between the phase change material and the electrode, having a deleterious effect on the programming of the phase change material. For example, in the case that the adhesive is highly conductive, the adhesive can effectively short out the phase change material (when in a highly resistive amorphous state) by shorting the contact to the crystalline phase change material. In the case that the adhesive is insulating, or low conductivity, the opposite problem is encountered, namely, the adhesive adds additional resistance in series with the crystalline programmed phase change material.

Further, in currently known devices, intermixing of the adhesive and the phase change material can also occur, and becomes more likely with higher temperatures. Such intermixing can cause a programming failure of the phase change material. Therefore, the choice of adhesive utilized is limited, or restricted to adhesive that resists intermixing at a given temperature.

A memory device utilizing programmable material to determine the state of memory elements of the device is described that reprograms to an amorphous and crystalline state. The described memory device and method provides improved device reliability and improved programmable cycle life relative to previous devices. Further, in an embodiment, the apparatus is manufacturable with conventional process toolsets and facilities.

In an embodiment, an adhesive is utilized between the phase change material and the dielectric. In an embodiment, concerns of delamination of the phase change material, deleterious effects on programming of the phase change material, and intermixing of the adhesive with the phase change material is controlled and minimized.

Figure 1:
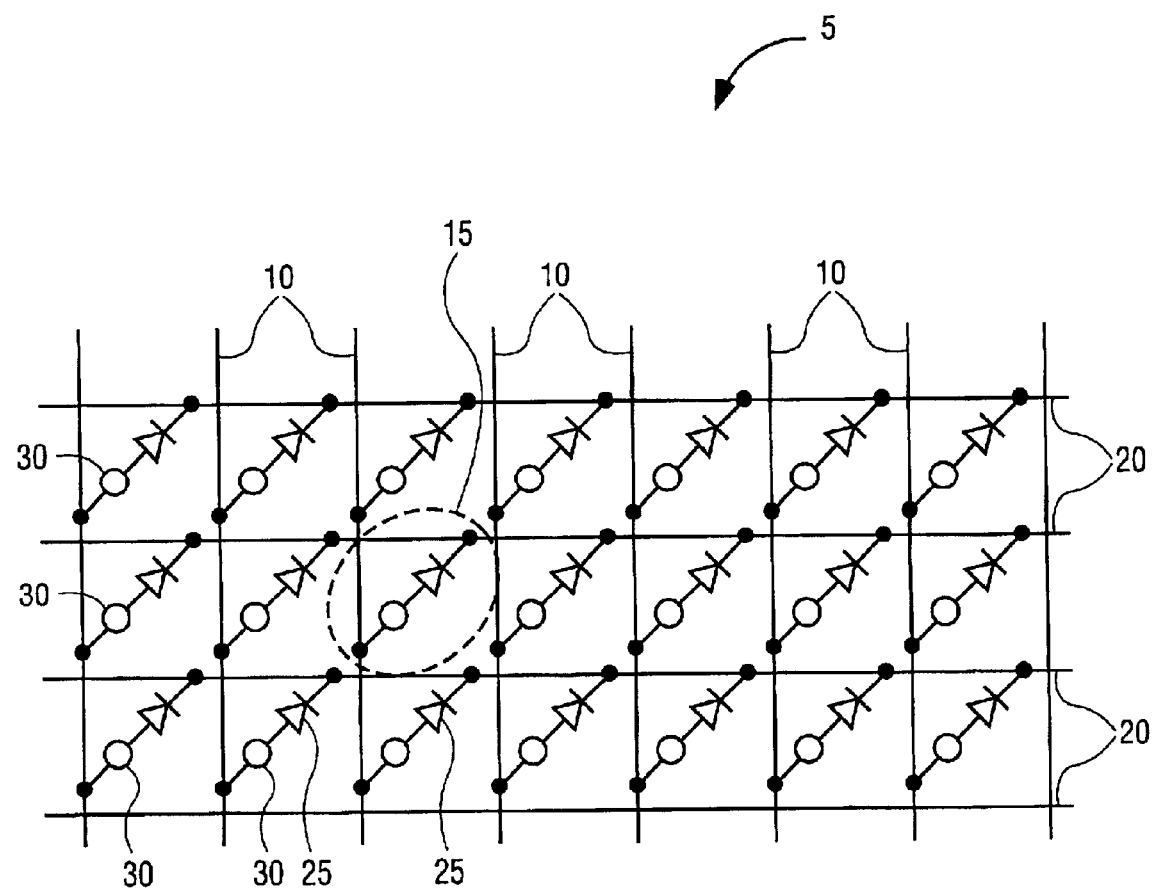
FIG. 1 is a schematic diagram of an embodiment of an array of memory elements.

FIG. 1 shows a schematic diagram of an embodiment of a memory array comprised of a plurality of memory elements presented and formed in the context of the description provided herein. In this example, the circuit of memory array 5 includes an xy grid with memory elements 30 electrically interconnected in series with isolation devices 25 on a portion of a chip. Address lines 10 (e.g., columns) and 20 (e.g., rows) are connected, in one embodiment, to external addressing circuitry in a conventional manner. One purpose of the xy grid array of memory elements in combination with isolation devices is to enable each discrete memory element to be read and written without interfering with the information stored in adjacent or remote memory elements of the array.

A memory array such as memory device 5 of FIG. 1 can be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 can be fabricated over an area of the substrate at the wafer level and then the wafer reduced through singulation into discrete die or chips, some or all of the die or chips having a memory array formed thereon. Additional addressing circuitry (e.g., decoders, etc.) can be formed as known to those of skill in the art.

Figure 2:
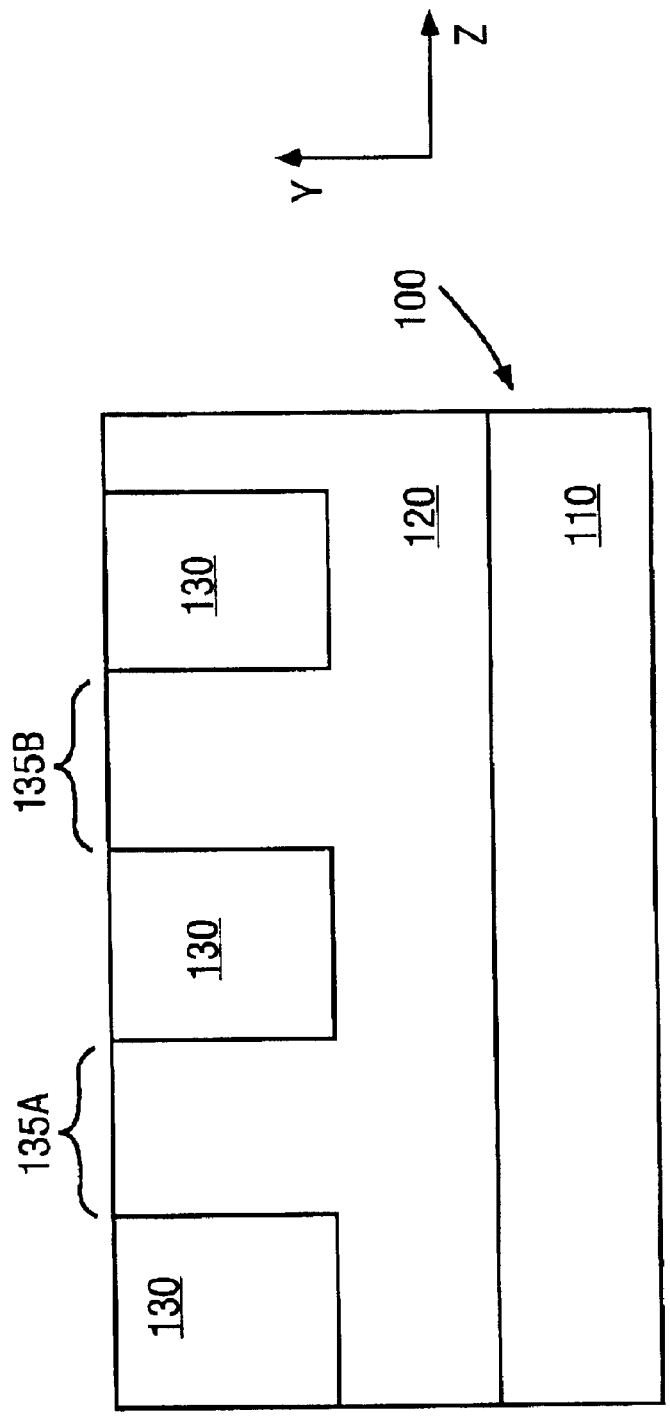
FIG. 2 schematically illustrates a cross-sectional planar side view of a portion of a semiconductor substrate having dielectric trenches formed therein defining a z-direction thickness of a memory cell in accordance with one embodiment of forming a memory element on a substrate.

FIGS. 2–14 illustrate an embodiment of the fabrication of representative memory element 15 of FIG. 1. FIG. 2 depicts a portion of substrate 100 that is, for example, a semiconductor (e.g., silicon) substrate. In this example, a P-type dopant such as boron is introduced in portion 110. In one example, a suitable concentration of P-type dopant is on the order of about $5 \times 10^{19}$ to $1 \times 10^{20}$ atoms per cubic centimeter (atoms/cm$^3$) rendering portion 110 of substrate 100 representatively P$^{++}$. Overlying portion 110 of substrate 100, in this example, is portion 120 of P-type epitaxial silicon. In one example, the dopant concentration is on the order of about $10^{16}$ to $10^{17}$ atoms/cm$^3$.

FIG. 2 also depicts shallow trench isolation (STI) structures 130 formed in epitaxial portion 120 of substrate 100. As will become apparent in the subsequent discussion, STI structures 130 serve, in one aspect, to define the z-direction thickness of a memory cell, with at this point only the z-direction thickness of a memory cell defined. In one embodiment, memory cell z-direction regions 135A and 135B are patterned as strips with the x-direction dimension greater than the z-direction dimension. In another aspect, STI structures 130 serve to isolate individual memory elements from one another as well as associated circuit elements (e.g., transistor devices) formed in and on the substrate. Current state of the art photolithography techniques utilized to pattern STI structures define the z-direction thickness of memory cell regions 135A and 135B can produce feature sizes (z-direction thickness) as small as 0.18 microns ($\mu$m).

Figure 3:
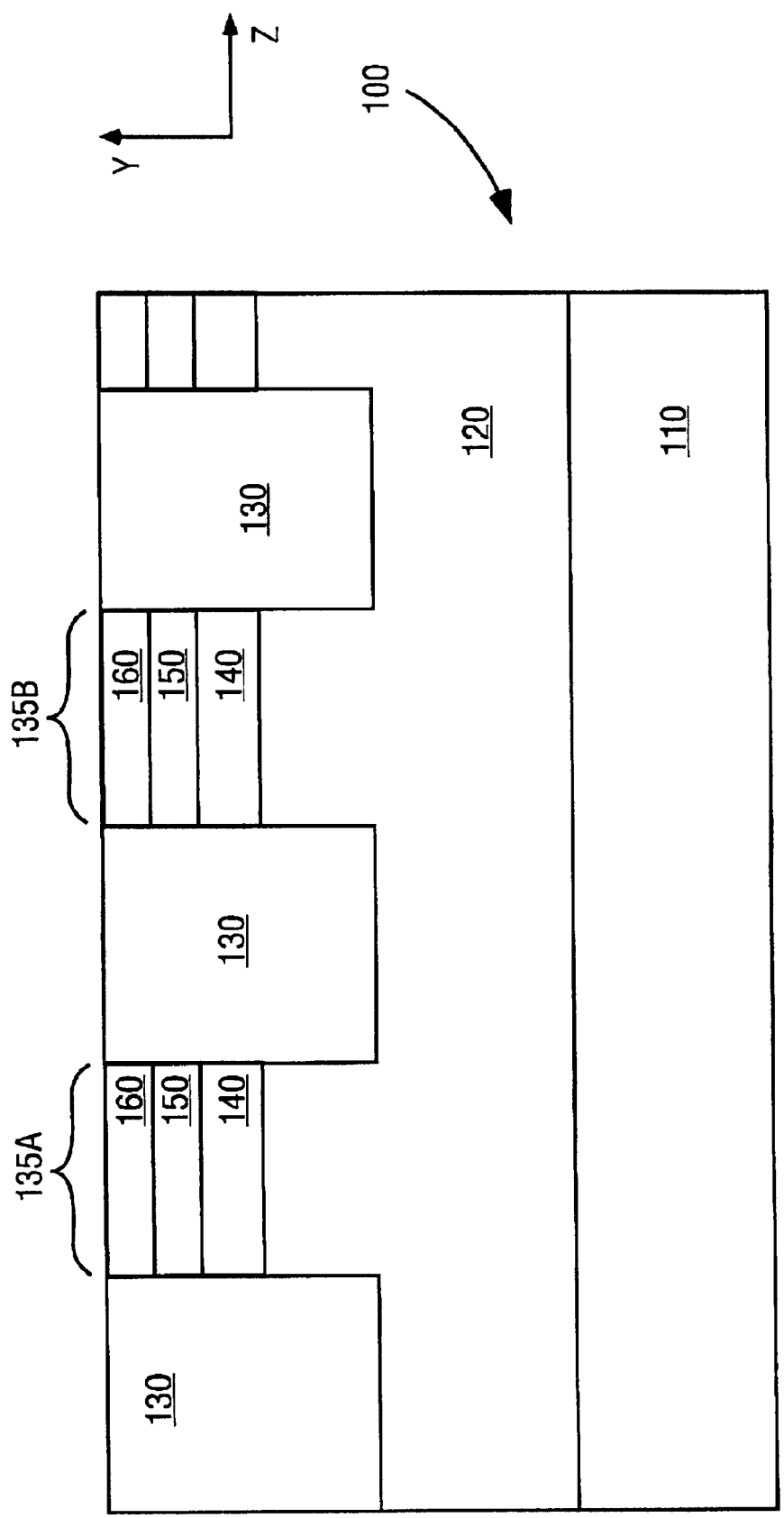
FIG. 3 depicts the structure of FIG. 2, through the same cross-sectional view, after the introduction of dopants to form an isolation device for a memory element.

FIG. 3 depicts the structure of FIG. 2 after further fabrication operations in memory cell regions 135A and 135B. Within each memory cell region (strip), overlying epitaxial portion 120 of substrate 100 is first conductor or signal line material 140. In one example, first conductor or signal line material 140 is N-type doped polysilicon formed by the introduction of, for example, phosphorous or arsenic to a concentration on the order of about $10^{18}$ to $10^{19}$ atoms/cm$^3$ (e.g., N$^+$ silicon). In this example, first conductor or signal line material 140 serves as an address line, a row line (e.g., row line 20 of FIG. 1). Overlying first conductor or signal line material 140 is an isolation device (e.g., isolation device 25 of FIG. 1). In one example, the isolation device is a PN diode formed of N-type silicon portion 150 (e.g., dopant concentration on the order of about $10^{14}$ to $10^{18}$ atoms/cm$^3$) and P-type silicon portion 160 (e.g., dopant concentration on the order of about $10^{19}$ to $10^{20}$ atoms/cm$^3$). Although a PN diode is shown, it is to be appreciated that other isolation structures are similarly suitable. Such devices include, but are not limited to, metal oxide semiconductor (MOS) devices.

Figure 4:
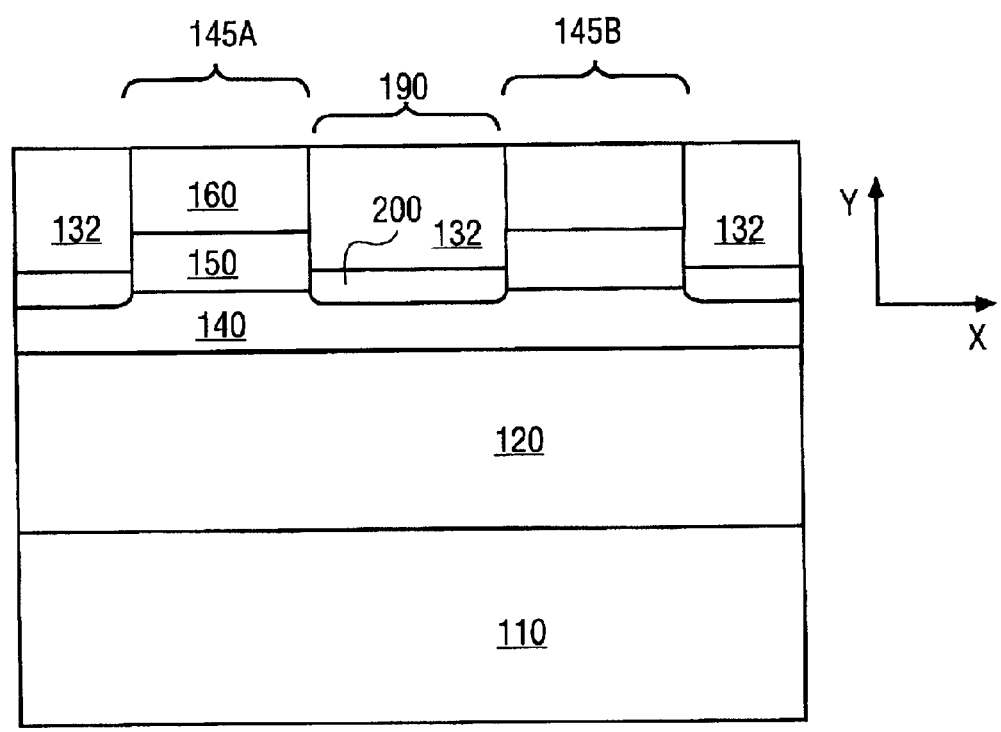
FIG. 4 depicts the structure of FIG. 3 after forming the trenches.

FIG. 4 depicts the structure of FIG. 3 from an xy perspective after forming trenches 190 in epitaxial portion 120 of substrate 100. Trenches 190 are formed, in this example, orthogonal to STI structures 130. Trenches 190 define the x-direction thickness of a memory cell. According to current photolithographic techniques, a suitable feature size for the x-direction thickness is as small as 0.25 μm. FIG. 4 also depicts memory cells 145A and 145B separated by trenches 190, having a z-direction thickness defined by STI structures 130 and an x-direction thickness defined by trenches 190. The definition of the x-direction thickness involves, in one embodiment, an etch to the conductor or signal line 140 of the memory line stack to define memory cells 145A and 145B of memory cell region 135A. In the case of an etch, the etch proceeds through the memory line stack to, in this example, a portion of conductor or signal line 140. A timed etch can be utilized to stop an etch at this point. Following the patterning, N-type dopant is introduced at the base of each trench 190 to form pockets 200 having a dopant concentration on the order of about $10^{18}$ to $10^{20}$ atoms/cm$^3$ (e.g., N$^+$ region) between memory cells 145A and 145B.

Figure 5:
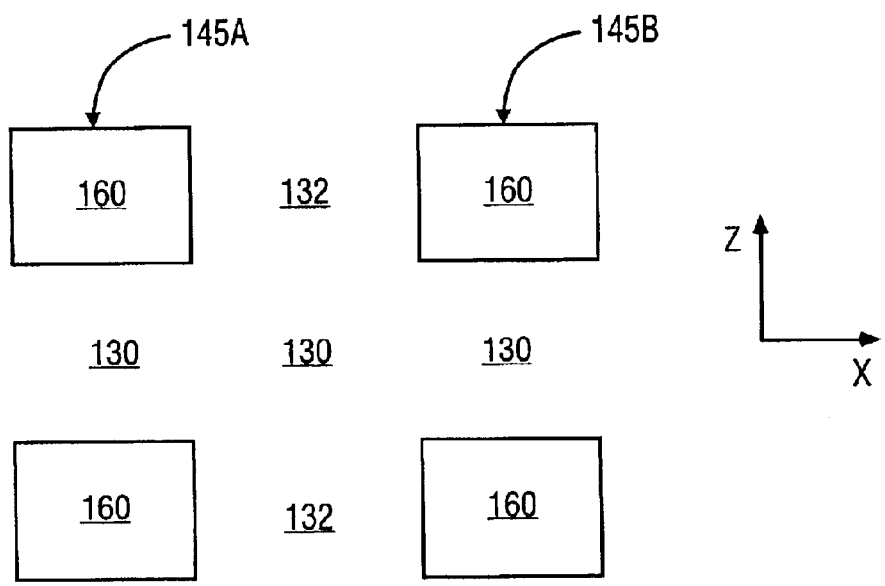
FIG. 5 depicts a schematic top view of the structure of FIG. 4.

Following the introduction of pockets 200, a dielectric material such as silicon dioxide is introduced in trenches 190 to form STI structures 132. The superior surface (as viewed) may then be planarized with, for example, a chemical-mechanical polish. FIG. 5 depicts an xz perspective of the structure of FIG. 4 with memory cells (e.g., memory cells 145A and 145B) separated by STI structures 130 and 132.

Figure 6:
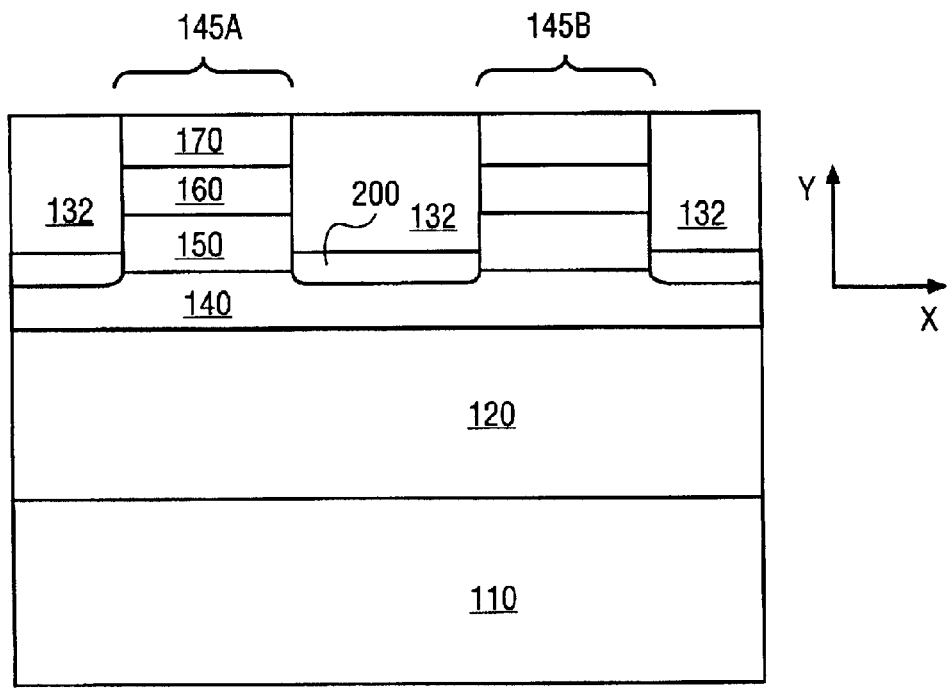
FIG. 6 depicts the structure of FIG. 4 after forming contacts.

FIG. 6 depicts the structure of FIG. 4 (i.e., an xy perspective) following the formation of a material of, in this example, refractory metal silicide such as cobalt silicide (CoSi$_2$) in a portion of p-type silicon portion 160 to define contact 170. Contact 170, in one aspect, serves as a low resistance material in the fabrication of peripheral circuitry (e.g., addressing circuitry) of the circuit structure on the chip.

Figure 7:
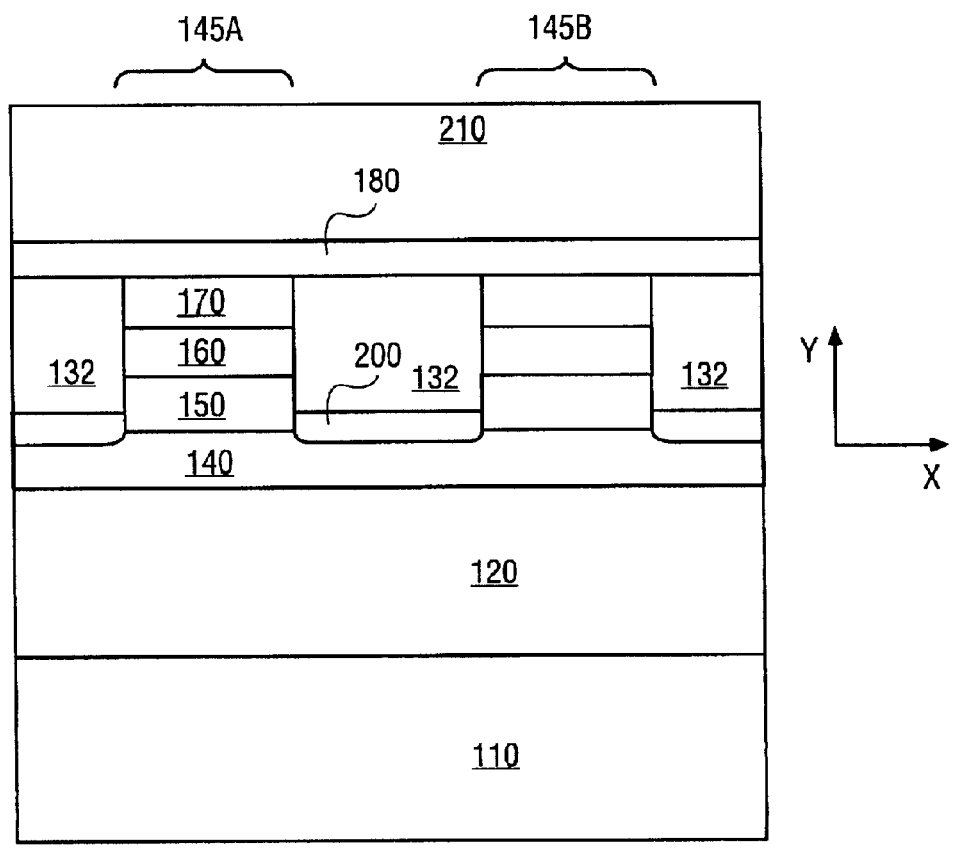
FIG. 7 depicts the structure of FIG. 6, through the same cross-sectional view, after forming a masking material and a dielectric material.

FIG. 7 depicts the structure of FIG. 6 after the introduction of masking material 180. As will become more clear later, masking material 180 serves, in one sense, as an etch stop for a subsequent etch operation. In one embodiment, a suitable material for masking material 180 is a dielectric material such as silicon nitride (Si$_3$N$_4$).

FIG. 7 also depicts dielectric material 210 introduced over the structure to a thickness on the order of 100 Å to 50,000 Å sufficient to blanket memory cells 145A and 145B. In one embodiment, dielectric material 210 is SiO$_2$. In another embodiment, dielectric material 210 is a material selected for its reduced thermal conductivity, K, preferably a thermal conductivity less than $\kappa_{SiO_2}$, more preferably three to 10 times less $\kappa_{SiO_2}$. As a general convention, SiO$_2$ and Si$_3$N$_4$ have κ values on the order of 1.0. Thus, in addition to SiO$_2$, suitable materials for dielectric material 210 include those materials that have κ values less than 1.0. Certain high temperature polymers having κ values less than 1.0, include carbide materials, Aerogel, Xerogel (κ on the order of 0.1) and their derivatives.

Figure 8:
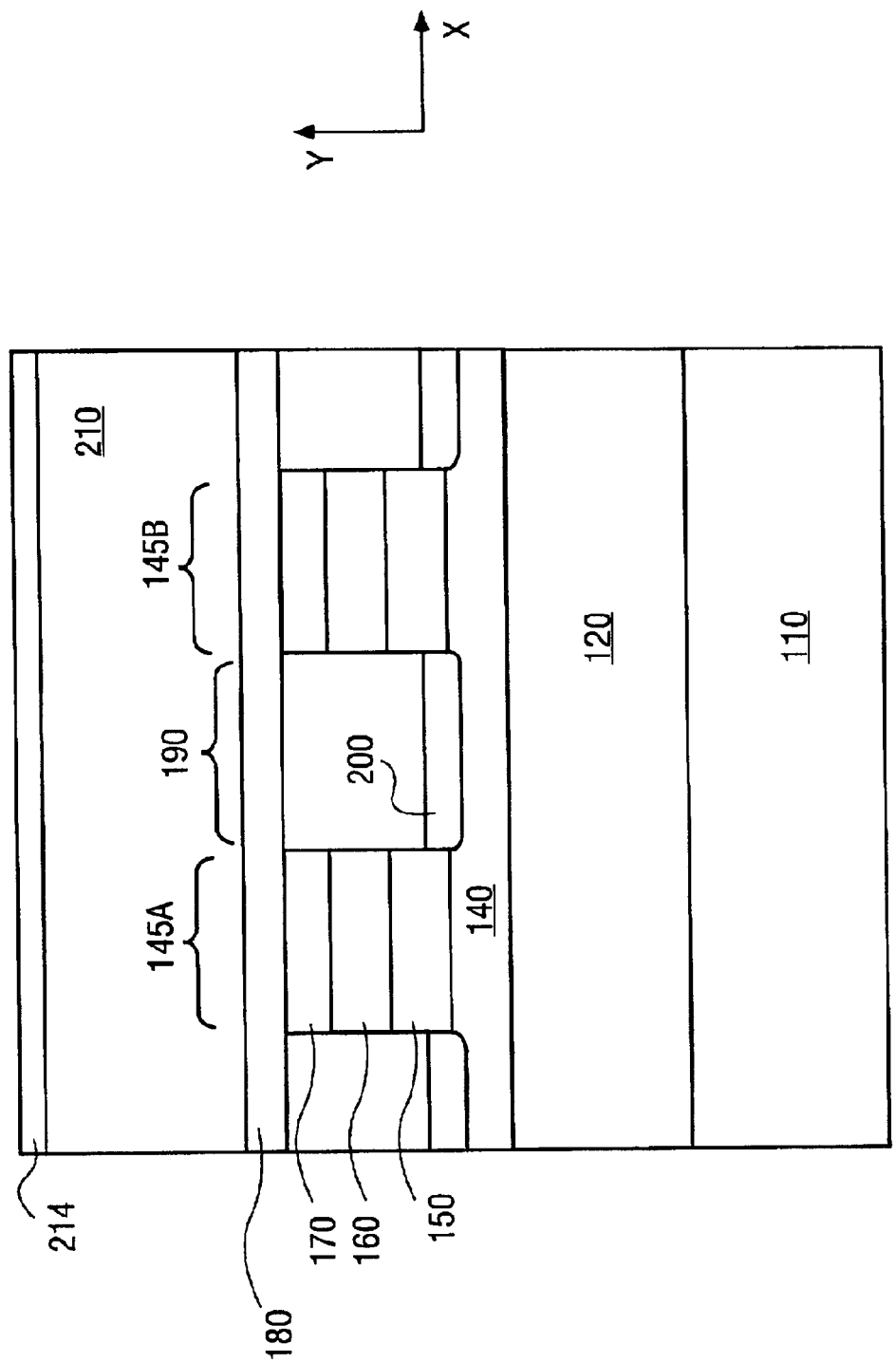
FIG. 8 depicts the structure of FIG. 7, through the same cross-sectional view, after forming an adhesive on the dielectric.

FIG. 8 depicts the structure of FIG. 7, after forming adhesive 214 on dielectric 210. While a variety of adhesive materials can be utilized for adhesive 214, in an embodiment, adhesive 214 includes at least one of polysilicon and titanium.

Figure 9:
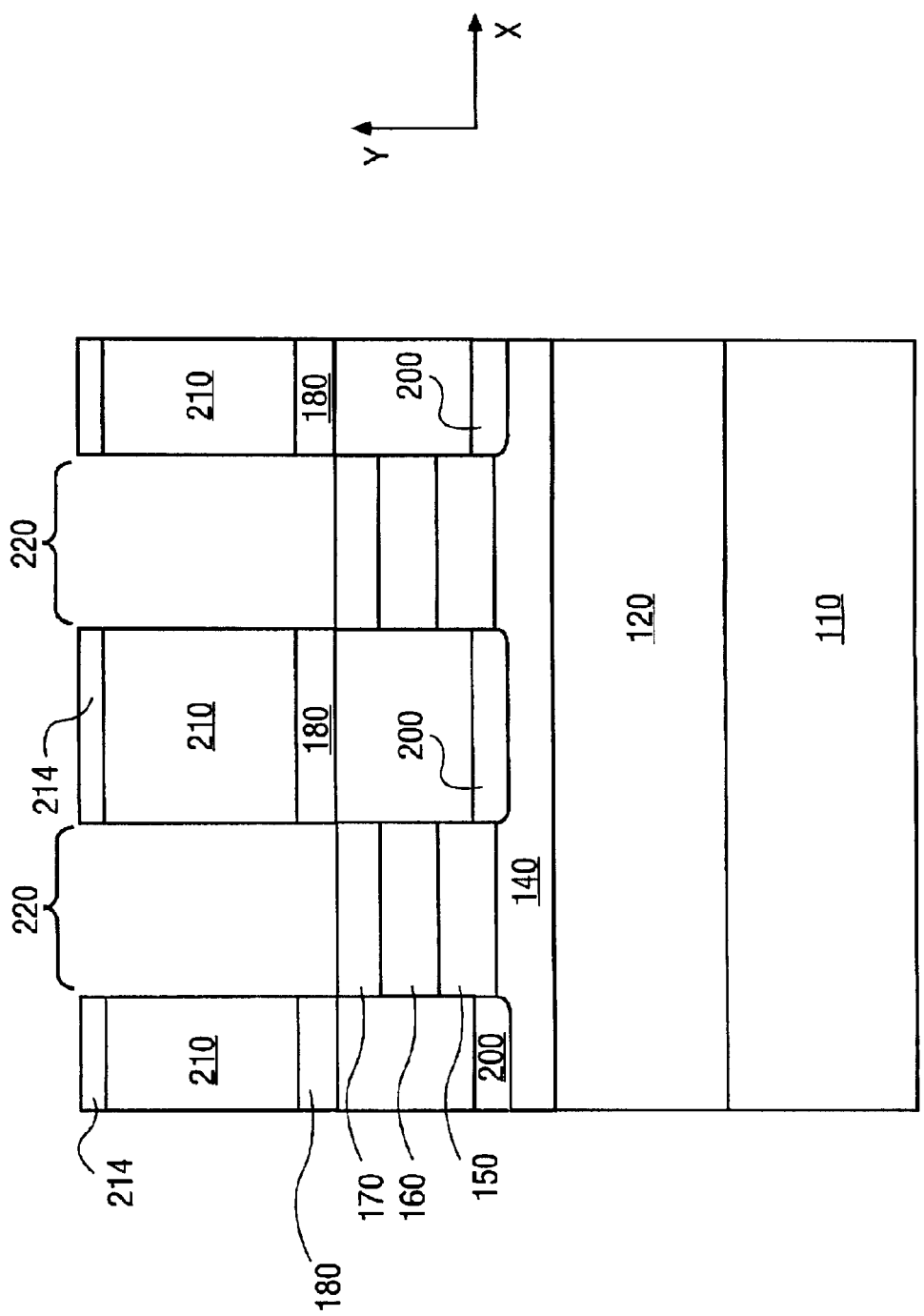
FIG. 9 depicts the structure of FIG. 8, through the same cross-sectional view, after forming an opening through the adhesive and the dielectric exposing the contact.

FIG. 9 depicts the structure of FIG. 8, through the same cross-sectional view, after forming openings 220 through adhesive 214, dielectric 210 and masking material 180, exposing contact 170. In one embodiment, openings 220 are formed by patterning of circular holes etched through adhesive 214, dielectric 210 and masking material 180, using photolithography and dry etching techniques. In terms of state of the art photolithography techniques, circular openings as small as 0.18 μm in diameter can be patterned. It is to be appreciated that, in addition to circular openings, other openings such as rectangular openings could alternatively be employed. By forming openings 220 in this manner (i.e., after introducing adhesive 214) in an embodiment, the result is an absence of an adhesive layer on contact 170 such that current is not shunted from the subsequently introduced programmable material (see FIG. 12).

Figure 10:
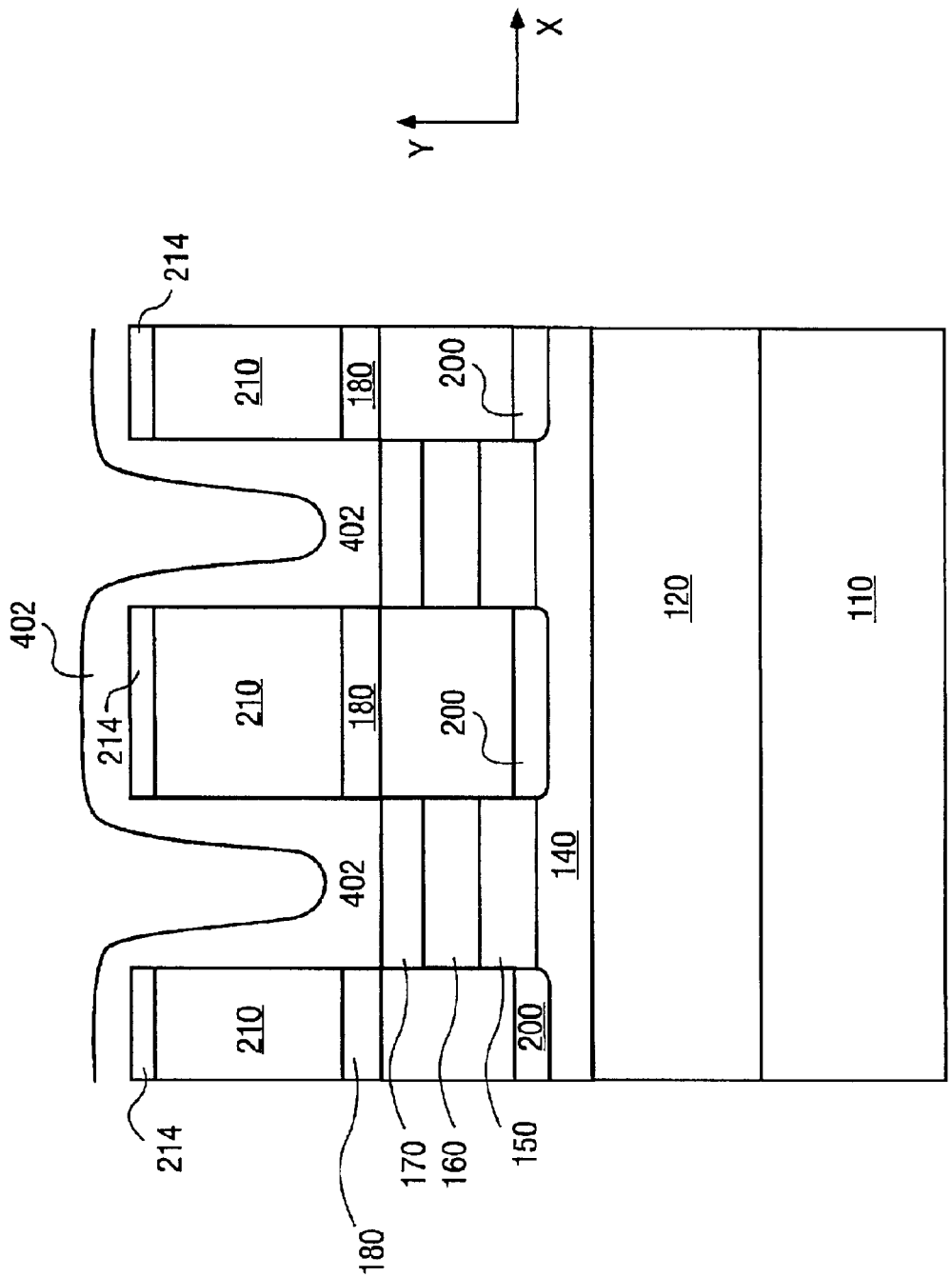
FIG. 10 depicts the structure of FIG. 9, through the same cross-sectional view, after conformally forming a spacer within the opening and on the adhesive.

FIG. 10 depicts the structure of FIG. 9, through the same cross-sectional view, after forming optional spacer material 402 within openings 220, on adhesive 214, and on dielectric 210. In one embodiment, spacer material 402 is conformally formed, for example by chemical vapor deposition of tetra-ethyl-ortho-silicate (TEOS) on the substrate. As shown in FIG. 10, spacer material covers contact 170 within openings 220.

Figure 11:
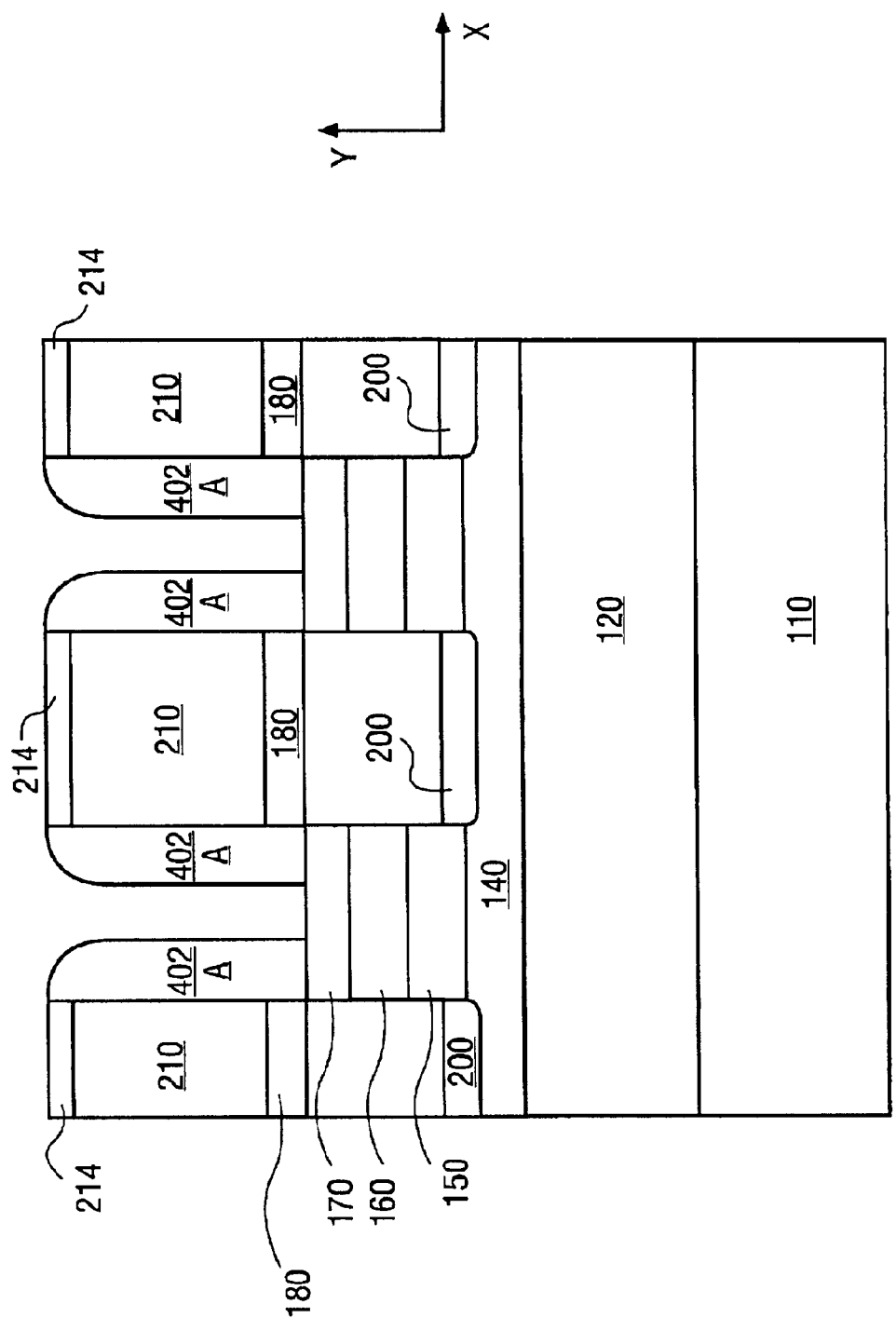
FIG. 11 depicts the structure of FIG. 10, through the same cross-sectional view, after etching the spacer.

FIG. 11 depicts the structure of FIG. 10 after spacer material 402 is patterned to form dielectric spacers (spacer material portions 402A) inside openings 220. In one embodiment, spacer material 402 is anisotropically etched using an etching agent that is selective such that the etching agent stops at, or preserves, contact 170. As shown in FIG. 11, the etching operation exposes adhesive 214 over the superior surface (as viewed) of dielectric 210. In one aspect, that will become more clear later, spacer material 402 serves to reduce the quantity of programmable material (FIG. 12) on contact 170. Spacer material portions 402A are optional in that, in another embodiment, programmable material may be formed within openings 220, without spacer material 402 being introduced within openings 220.

Figure 12:
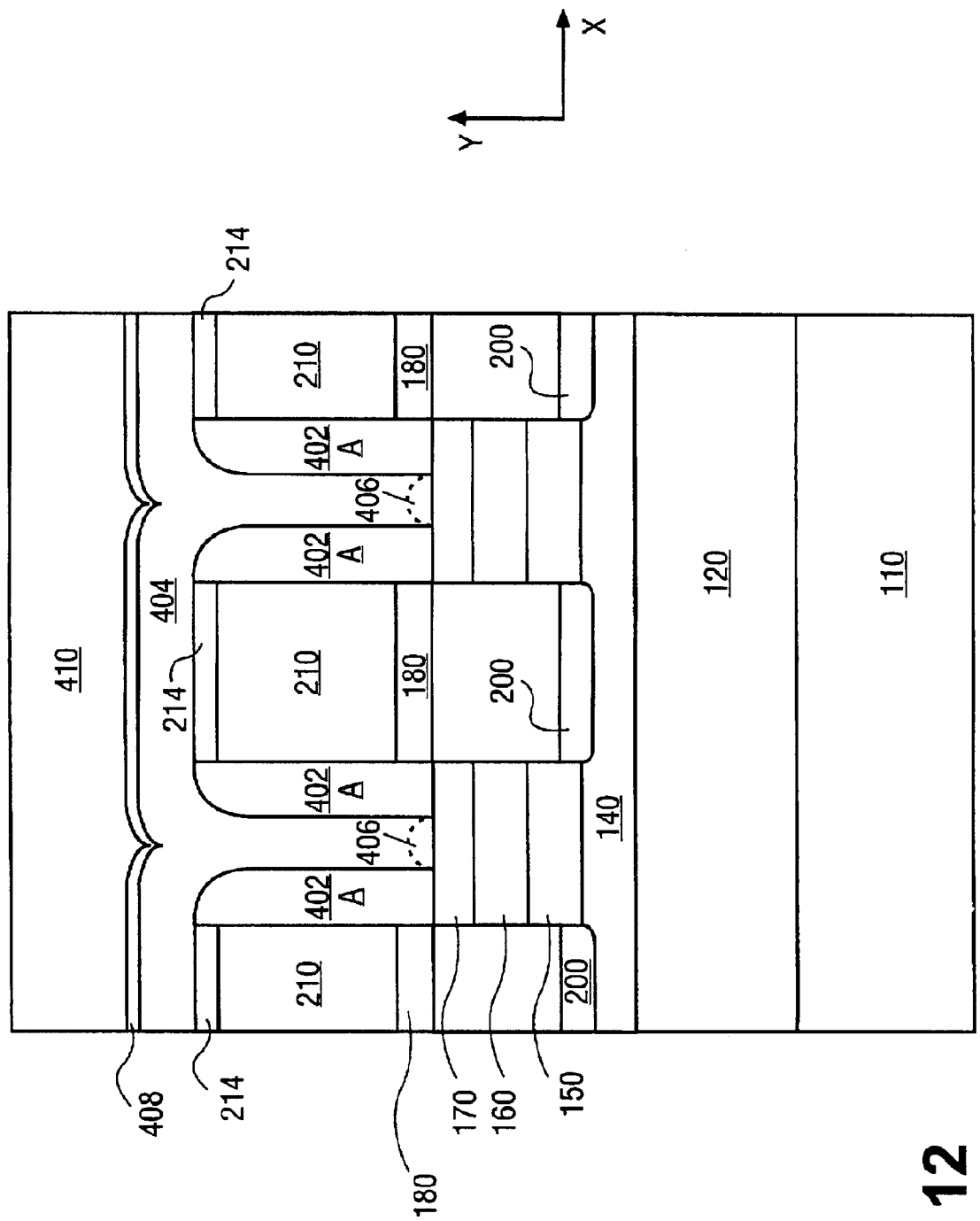
FIG. 12 depicts the same cross-sectional view of the structure of FIG. 11, after forming programmable material, a barrier and a conductor.

FIG. 12 depicts the structure of FIG. 11 after introducing programmable material 404 on adhesive 214, within openings 220, and on contact 170. In one aspect, programmable material 404 tends to adhere or remain in association with adhesive 400. In one embodiment, programmable material 404 is a phase change material that has a property such that its physical state (e.g., crystalline, amorphous) can be modified with the application of an amount of energy (e.g., electrical energy, thermal energy). Chalcogenide materials having the general formula are known to be suitable for this purpose. In an embodiment, chalcogenide materials suitable as programmable material 404 include at least one element from column VI of the Periodic Table Of The Elements. In an embodiment, Ge$_2$Sb$_2$Te$_5$ is utilized as programmable material 404. Other chalcogenide alloys utilized as programmable material 404 include GaSb, InSb, InSe, Sb$_2$Te$_3$, GeTe, InSbTe, GaSeTe, SnSb$_2$Te$_4$, InSbGe, AgInSbTe, (GeSn) SbTe, GeSb(SeTe), and Te$_{81}$Ge$_{15}$Sb$_2$S$_2$. Chalcogenide materials can be introduced on the substrate and on contact 170 by conventional deposition techniques.

As further illustrated in FIG. 12, following the introduction of programmable material 404, barrier material 408 is formed on programmable material 404 and conductor 410 is formed on barrier material 408. Barrier material 408 serves, in an aspect, to prevent any chemical reaction between programmable material 404 and conductor 410. In an embodiment, programmable material 404, spacer 402, barrier material 408 and conductor 410 are formed using conventional patterning techniques. In an embodiment, barrier material 408 includes at least one of titanium and titanium nitride. Titanium and/or Titanium nitride coatings can be deposited uniformly on a substrate, showing good adhesion in that they resist flaking, blistering, chipping and peeling.

In the structure illustrated in FIG. 12, the contact area of programmable material 404 and contact 170 is minimized by the presence of spacer material portions 402A. In an aspect, the dimensions of openings 220 expose a first contact area of contact 170. In an aspect, a second contact area, less than the first contact area, is exposed by spacer material 402 and/or spacer material portions 402A. By minimizing the quantity of programmable material 404, the quantity of programmable material 404 that undergoes, for example, a phase change from/to amorphous and crystalline on contact 170 (as shown by region 406) is localized. Region 406, shown between spacer material portions 402A, defines a limited and localized programming region of programmable material 404, adding to the programmable reliability from and to an amorphous and crystalline state of programmable material 404. In general, by localizing the phase change area, less current is required through programmable material 404 during programming and reading, and less power consumption results.

Figure 13:
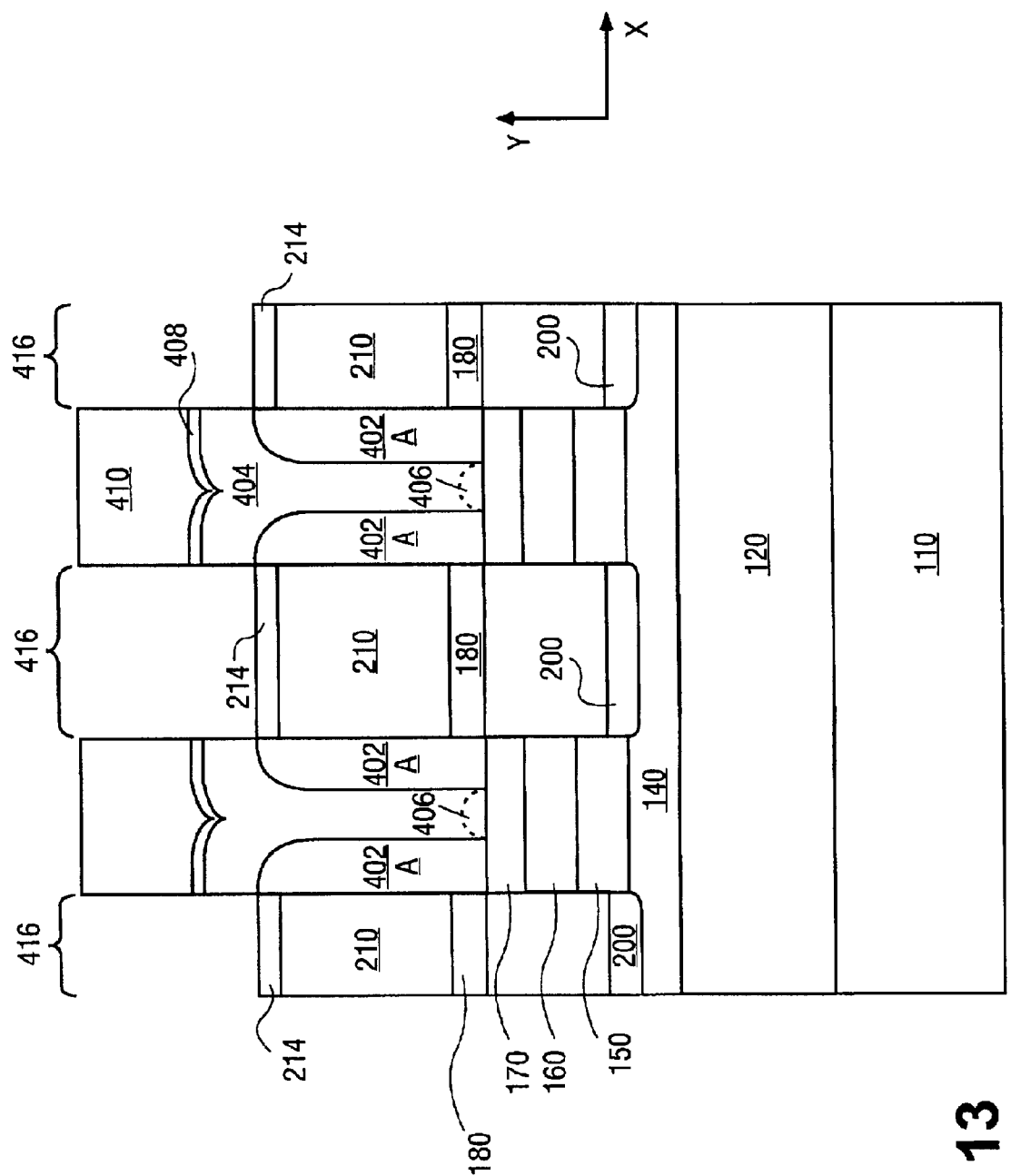
FIG. 13 depicts the same cross-sectional view of the structure of FIG. 12, after patterning the programmable material, barrier and conductor.

FIG. 13 depicts the structure of FIG. 12, from an xy perspective, after forming openings 416. Openings 416 serve, in one aspect, to define the x-direction thickness of programmable material 404, barrier material 408 and conductor 410. Openings 416 serve, in another aspect, to isolate individual memory elements from one another as well as associated circuit elements (e.g., transistor devices) formed on the substrate. In one embodiment, openings 416 are formed by simultaneously patterning of openings through conductor 410, barrier material 408, programmable material 404 and adhesive 214. The patterning can be accomplished using conventional photolithographic and etch techniques. In this example, the etching proceeds through conductor 410, barrier material 408, programmable material 404 and adhesive 214, to the exclusion of dielectric 210. According to current photolithographic techniques, a suitable feature size for the x-direction thickness of openings 416 include as small as 0.18 $\mu$m. As shown in FIG. 13, openings 416 form conductor 410 lines generally orthogonal to first conductor or signal line 140.

Figure 14:
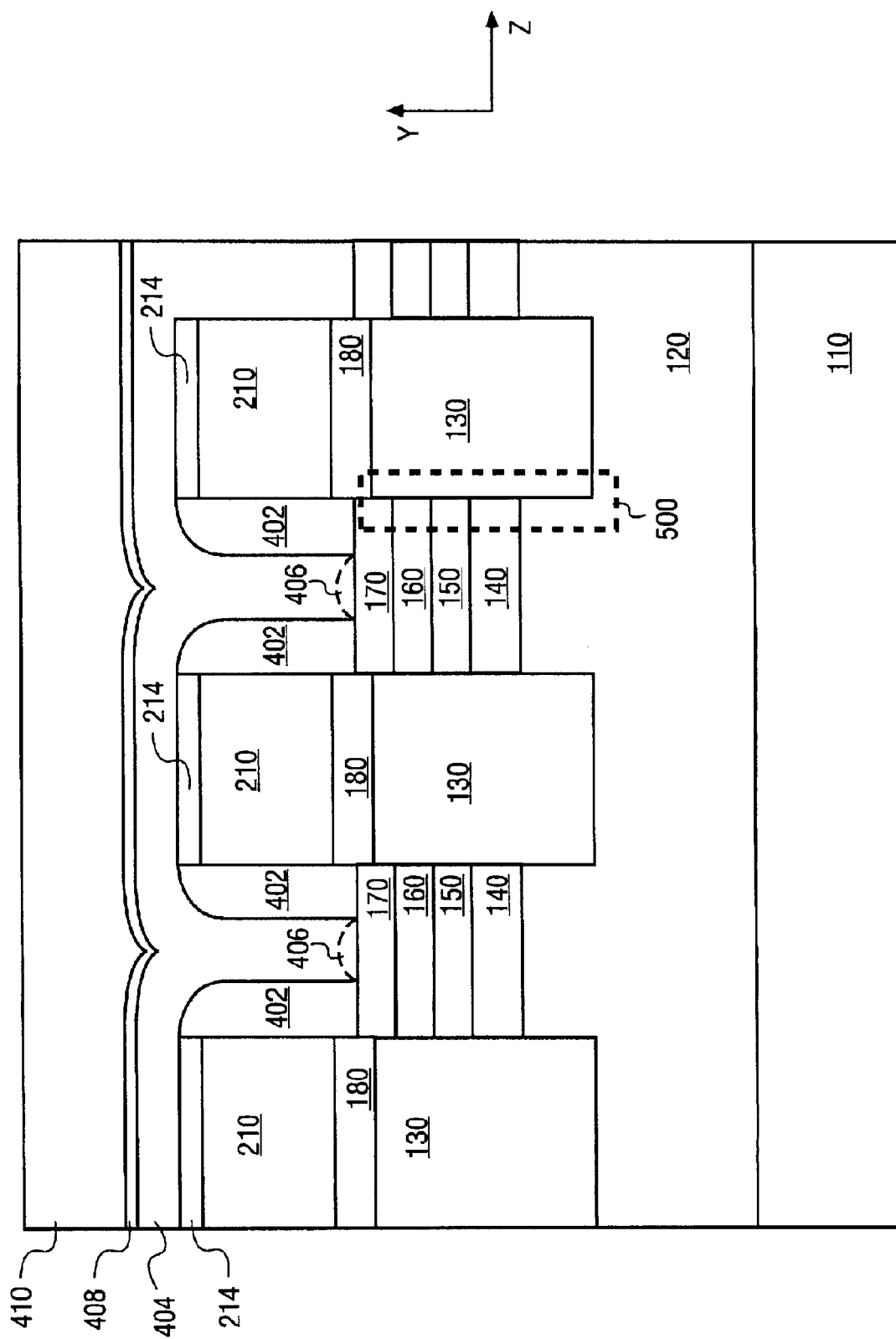
FIG. 14 depicts another cross-sectional view of the structure of FIG. 13.

FIG. 14 depicts another cross-sectional view, from the yz perspective, of the structure of FIG. 13. A heat sink, as illustrated by an area generally defined by lines 500 may be introduced adjacent the device structure to maintain a more stable temperature and cooler interface between programmable material 404 and contact 170.

Figure 15:
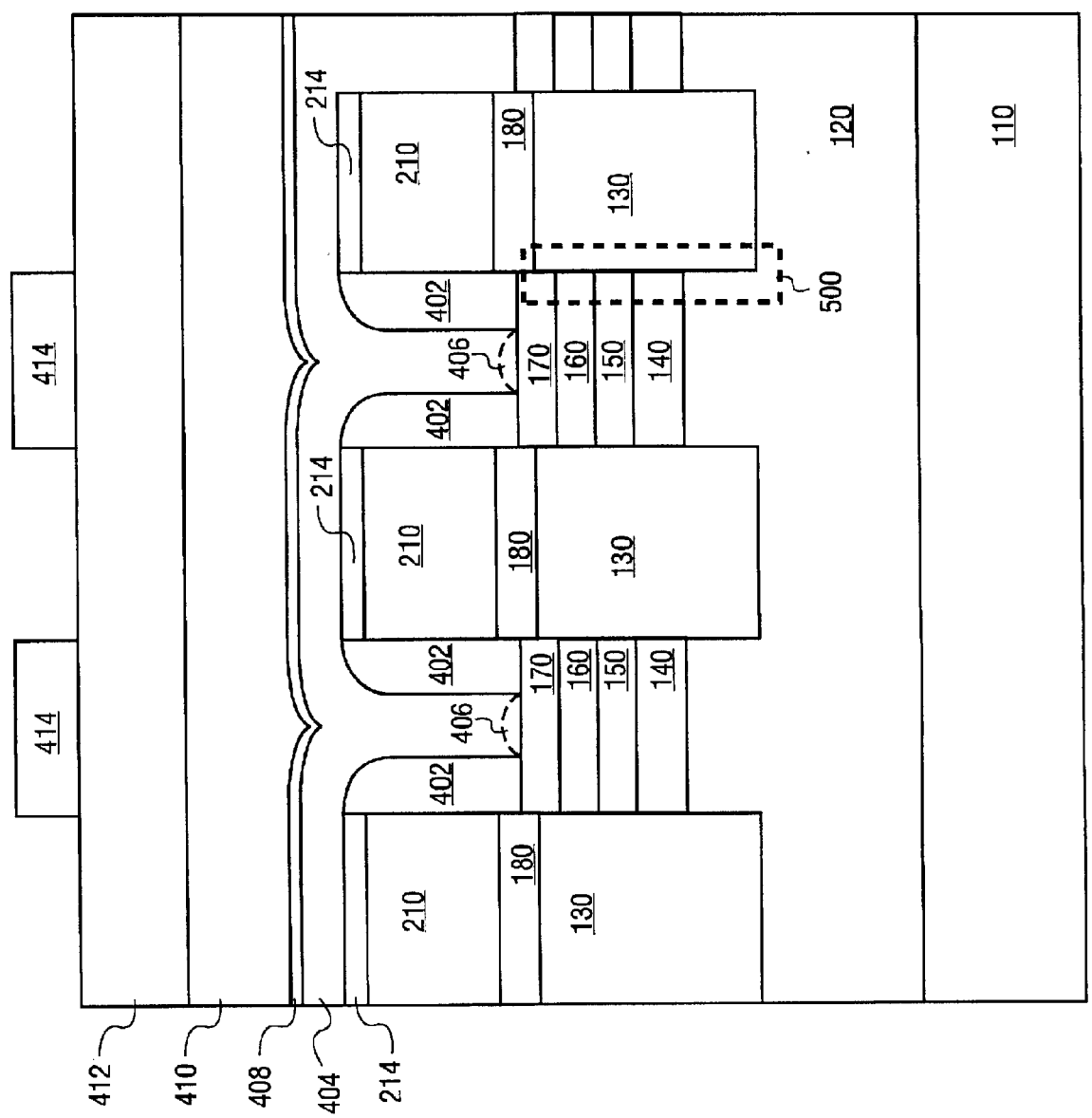
FIG. 15 depicts the same cross-sectional view of the structure of FIG. 14, after forming a dielectric material and a signal line.

FIG. 15 shows the structure of FIG. 14 after forming dielectric material 412 over conductor 410. Dielectric material 412 is, for example, $SiO_2$ or other suitable material that is formed on conductor 410 to electronically isolate conductor 410. Following the formation, dielectric material 412 is planarized and a via is formed in a portion of the structure through dielectric material 412, dielectric material 210, and dielectric material 180 to contact 170. The via is filled with conductive material such as tungsten (W) and a barrier material such as a combination of titanium (Ti) and titanium nitride (TiN). Techniques for introducing dielectric material 412, forming and filling conductive vias, and planarizing are known to those skilled in the art. The structure shown in FIG. 15 also shows additional conductor or signal line material 414 formed and patterned to mirror that of conductor or signal line material 140 (e.g., row line) formed on substrate 100. Mirror conductor line material 414 mirrors conductor or signal line material 140 and is coupled to conductor or signal line material 140 through the conductive via (not shown). By mirroring a doped semiconductor such as N-type silicon, mirror conductor line material 414 serves, in one aspect, to reduce the resistance of conductor or signal line material 140 in a memory array, such as memory array 5 illustrated in FIG. 1. A suitable material for mirror conductor line material 414 includes an aluminum material, such as an aluminum alloy.

Figure 16:
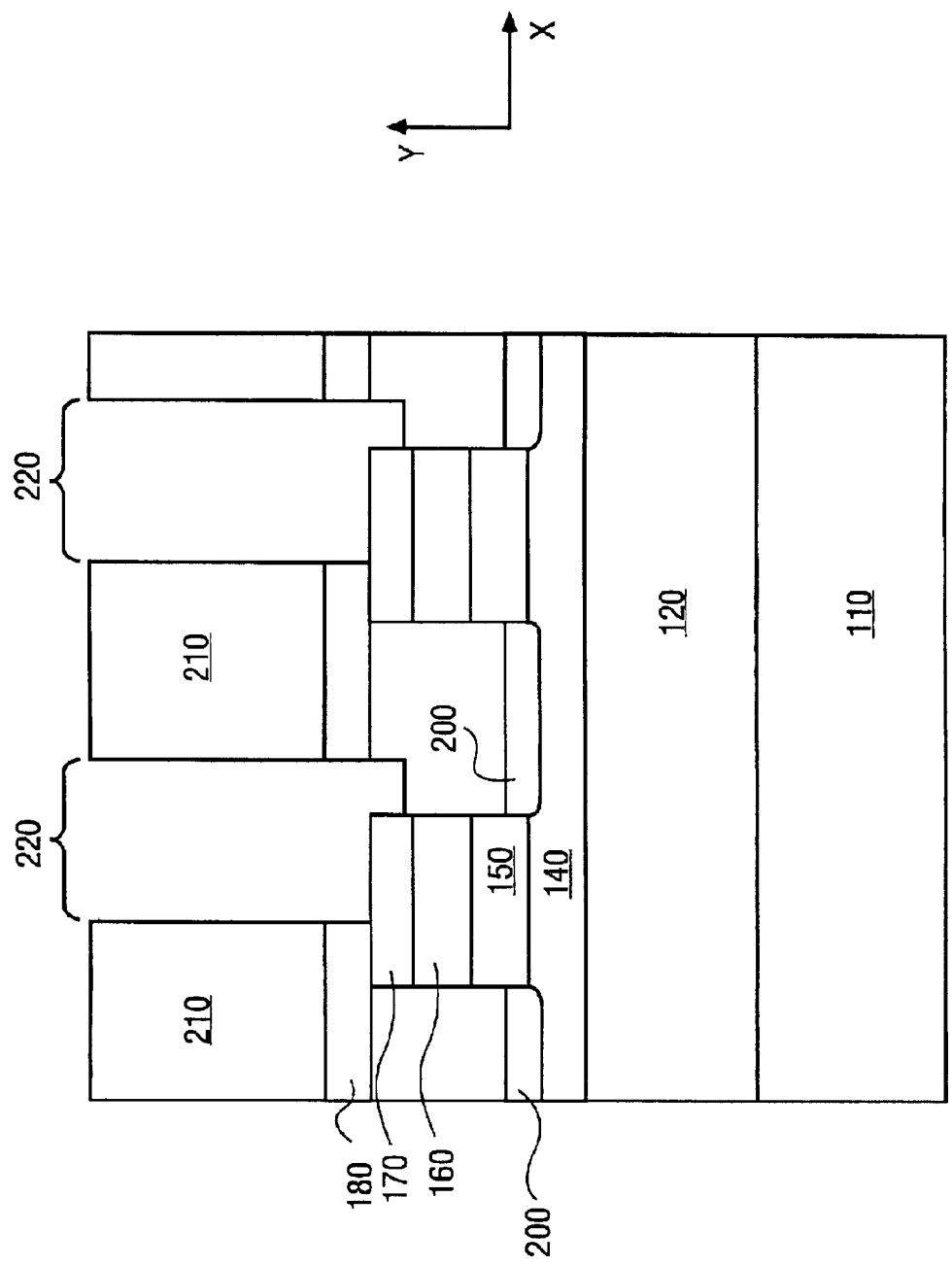
FIG. 16 depicts the structure of FIG. 7, through the same cross-sectional view, after forming an opening through the dielectric exposing the contact.

FIG. 16–FIG. 21 depict another embodiment than that described by FIG. 8–FIG. 15. FIG. 16 depicts the structure of FIG. 7, through the same cross-sectional view, after forming openings 220 through dielectric 210 and masking material 180, exposing contact 170. The formation of openings 220 may be accomplished using etch patterning with an etchant(s) selective for etching dielectric material 210 and masking material 180 but not contact 170 (e.g., contact 170 serves as an etch stop).

Figure 17:
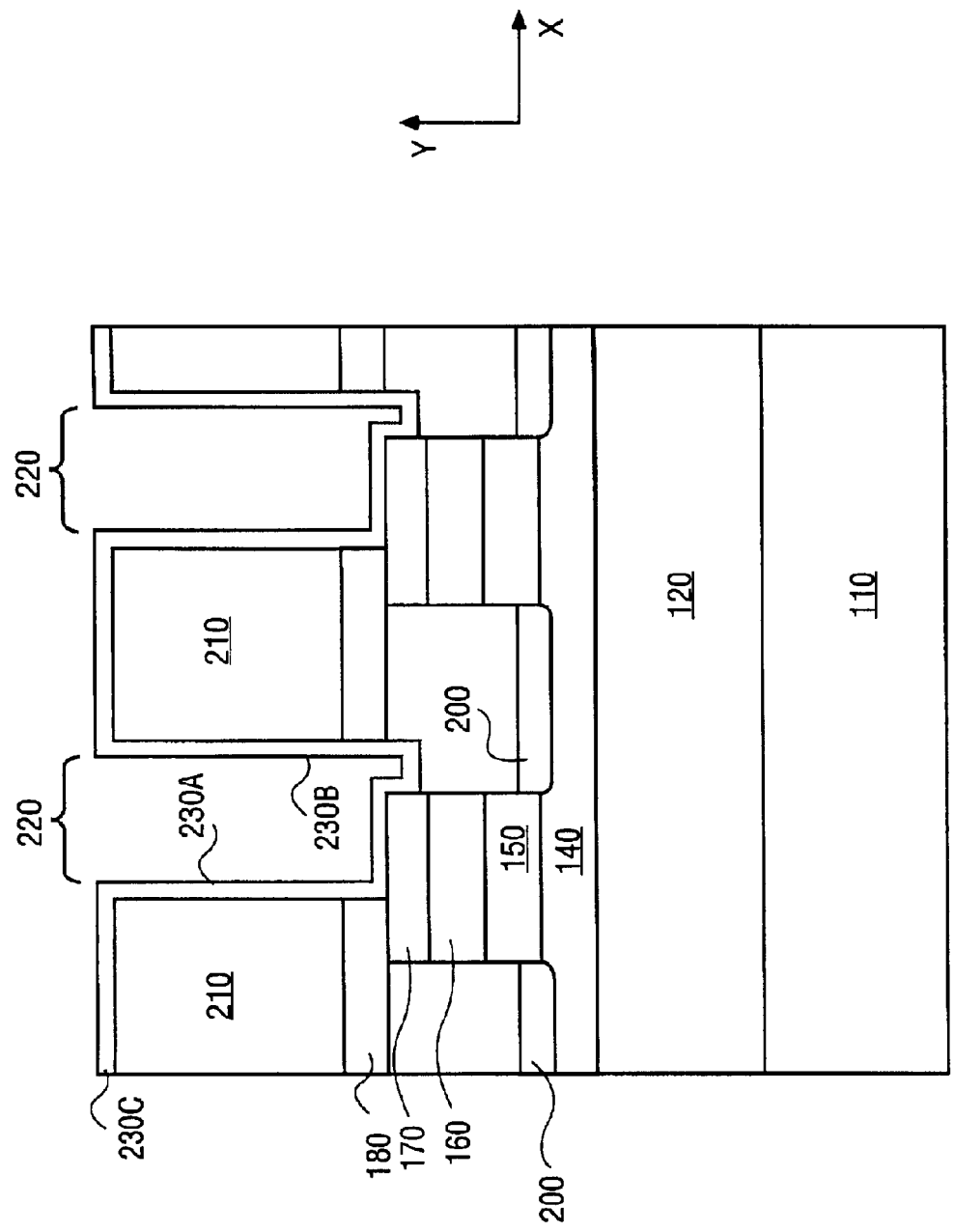
FIG. 17 depicts the structure of FIG. 16, through the same cross-sectional view, after forming an electrode on the contact.

FIG. 17 depicts the structure of FIG. 16 after the conformal introduction of electrode material 230. In one example, electrode material 230 is polycrystalline semiconductor material such as polycrystalline silicon. Other suitable materials include carbon and semi-metals such as transition metals including, but not limited to, titanium, titanium-tungsten (TiW), titanium nitride (TiN) and titanium aluminum nitride (TiAlN). The introduction is conformal in the sense that electrode material 230 is introduced along the side walls and base of openings 220 such that electrode material 230 is in contact with contact 170. The conformal introduction of electrode material 230 that is, for example, polycrystalline silicon may follow conventional introduction techniques known to those skilled in the art including chemical vapor deposition (CVD) techniques.

Figure 18:
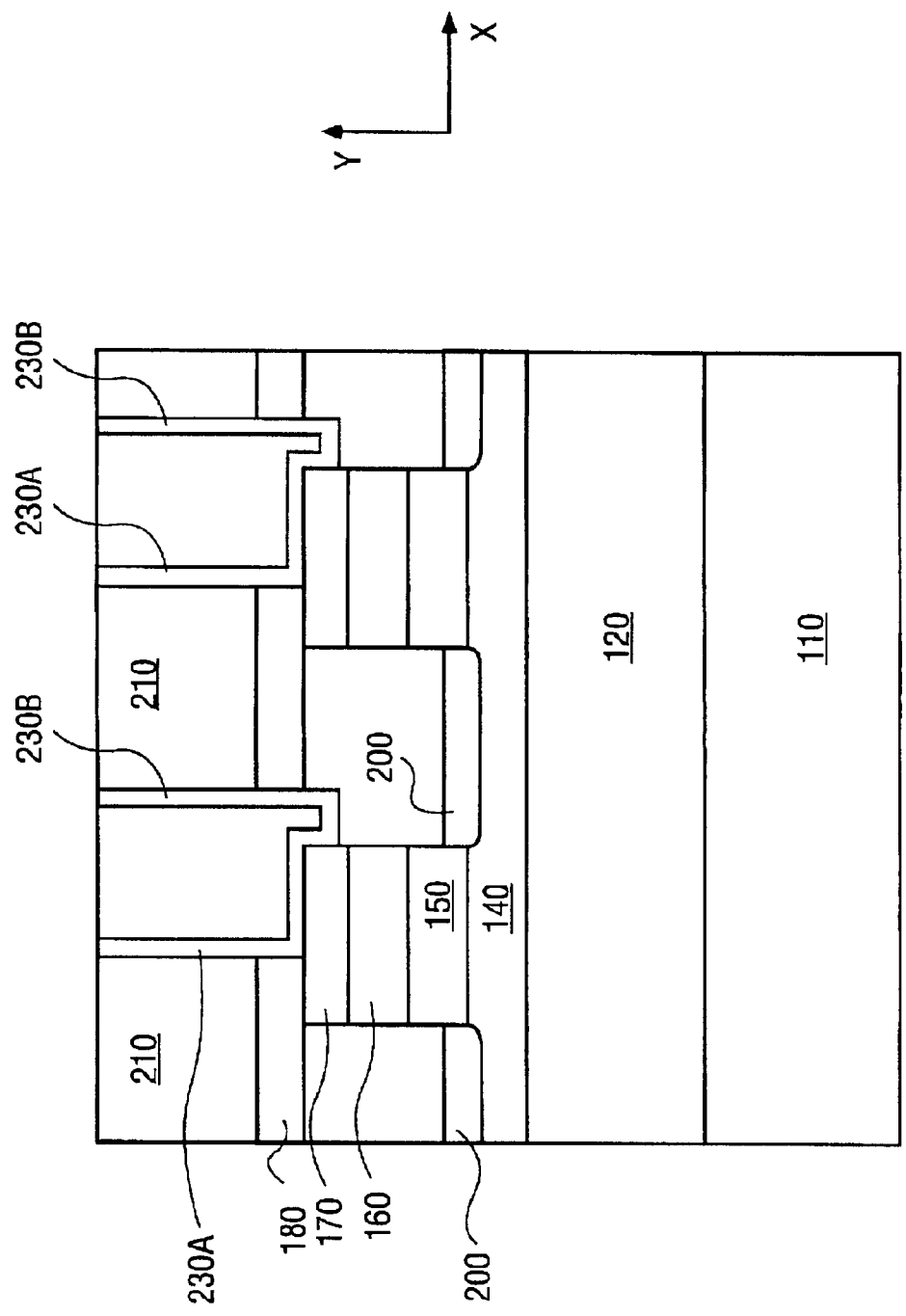
FIG. 18 depicts the structure of FIG. 17, through the same cross-sectional view, after forming a dielectric in the opening and removing a horizontal portion of the electrode.

FIG. 18 depicts the structure of FIG. 17 where only one of the leg portions of electrode material 230 serves as a conductive path between signal line material 140 and a subsequently introduced programmable material. In this example, electrode material 230 is a generally non-conductive intrinsic polycrystalline silicon. After the introduction of a dopant into a portion of electrode material 230, two portions are defined, electrode material 230A and electrode material 230B. Electrode material 230A is doped about its length from reducer material 170 and will act as a conductive path between signal line material 140 and subsequently introduced programmable material. Electrode material 230B is generally non-conductive (e.g., predominantly intrinsic polycrystalline silicon) and thus will generally not serve as a conductive path. The isolation of a single conductive path (such as electrode material 230A) may be accomplished through an angled introduction of a dopant (i.e., angled away from electrode material 230B).

FIG. 18 also shows the structure after the introduction of dielectric material 250 into openings 220. In one embodiment, dielectric material 250 is silicon dioxide ($SiO_2$). In another embodiment, dielectric material 250 is a material that has a thermal conductivity, κ, that is less than the thermal conductivity of $SiO_2$, $\kappa_{SiO_2}$ preferably three to 10 times less than $\kappa_{SiO_2}$. Following introduction, the structure is subjected to a planarization that removes the horizontal component of electrode material 230. Suitable planarization techniques include those known to those of skill in the art, such as chemical or chemical-mechanical polish (CMP) techniques.

Figure 19A:
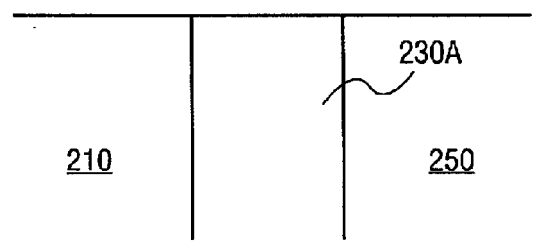
FIG. 19A–FIG. 19E depict the structure of FIG. 18, through the same cross-sectional view, showing the formation and patterning of an adhesive and a programmable material.

FIG. 19A–FIG. 19E depict the structure of FIG. 18, through the same cross-sectional view, showing the formation and patterning of an adhesive and a programmable material. FIG. 19A is an isolated view of a portion of electrode material 230A adjacent the superior surface of the structure as viewed in FIG. 18.

Figure 19B:
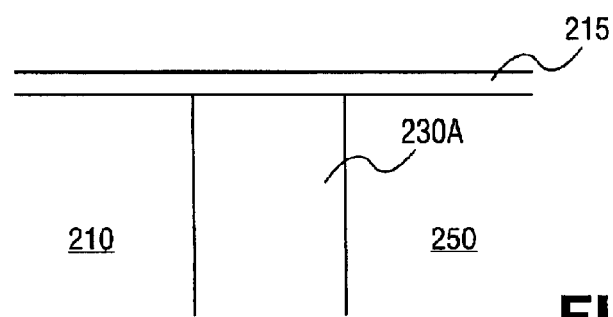
Figure 19C:
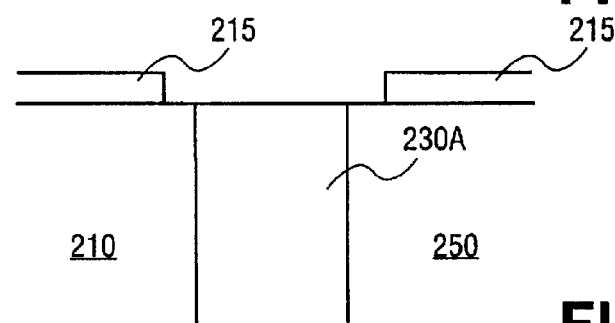
Figure 19D:
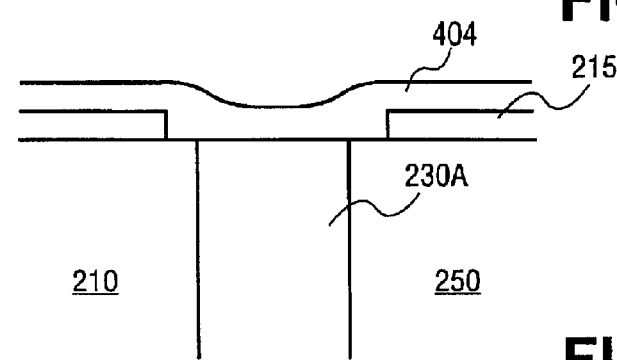
Figure 19E:
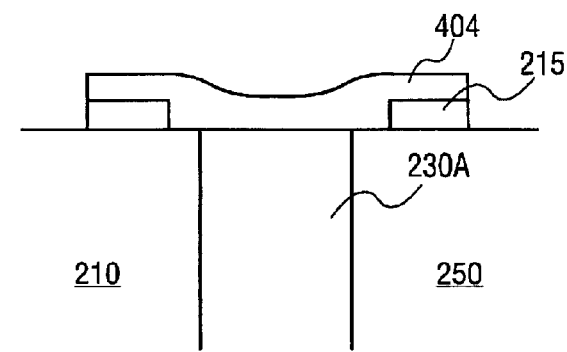

Referring to FIG. 19B, adhesive 215 is formed on dielectric 210, dielectric 250, and electrode material 230A. Next, adhesive 215 is patterned off of electrode material 230A (FIG. 19C). Subsequently, programmable material 404 is formed on adhesive 215, a portion of dielectric 210, dielectric 250, and electrode material 230A (FIG. 19D). In an embodiment, adhesive 215 and programmable material 404 are simultaneously patterned over an area adjacent electrode material 230A (FIG. 19E). The patterning can be accomplished using conventional photolithographic and etch techniques. In this example, the etching proceeds through a portion of adhesive 215 and programmable material 404, to the exclusion of dielectric 210 and dielectric 250.

Figure 20:
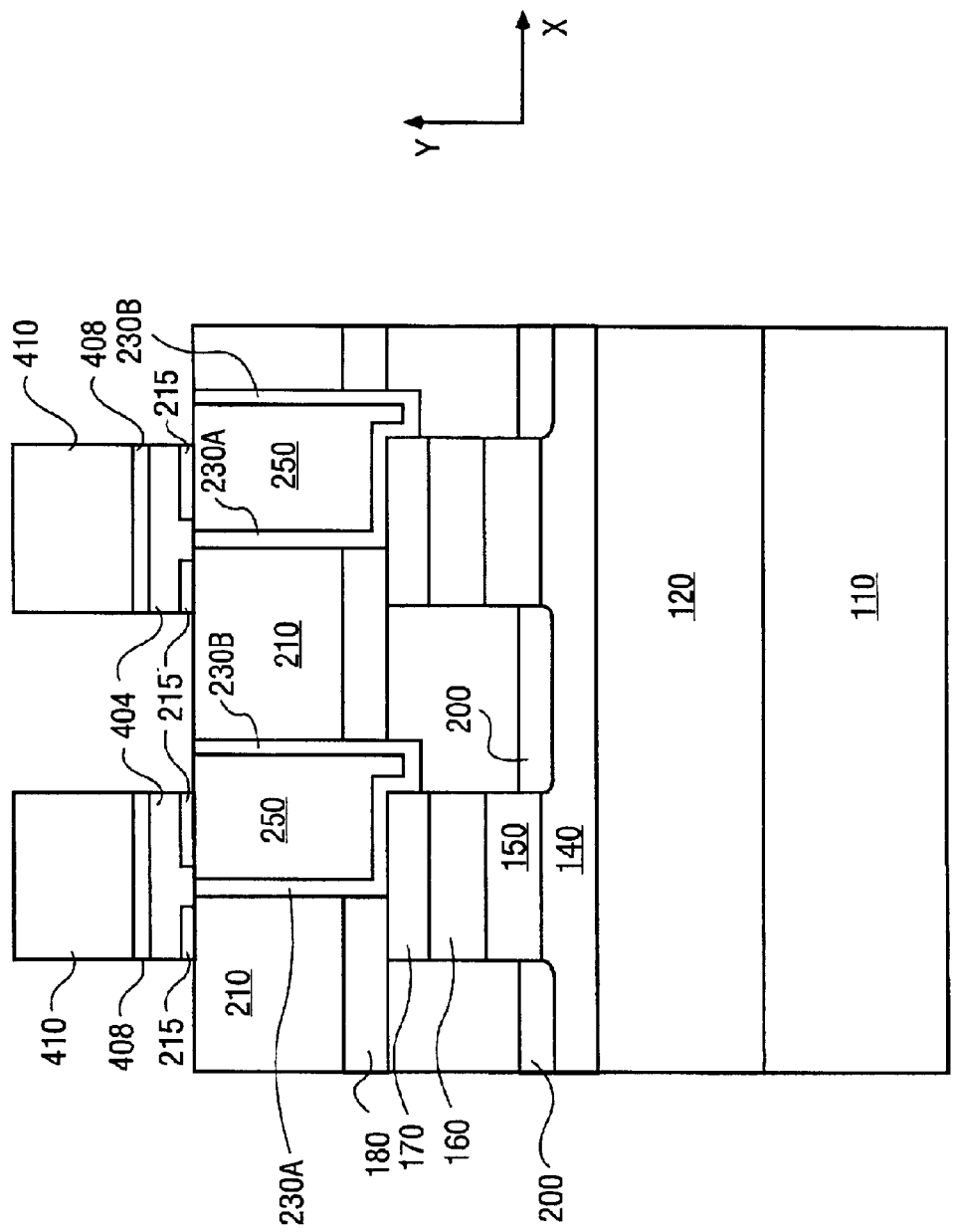
FIG. 20 depicts the structure of FIG. 19E, through the same cross-sectional view, after the formation and patterning of a barrier on the programmable material and a conductor on the barrier.

FIG. 20 depicts the structure of FIG. 19E, through the same cross-sectional view, after the formation and patterning of conductor 410, barrier 408, programmable material 404, and adhesive 215. Barrier 408 includes one of, for example, titanium (Ti) and titanium nitride (TiN). Barrier 408 serves, in one aspect, to inhibit diffusion between the volume of programmable material 404 and second conductor or signal line material overlying the volume of programmable material 404 (e.g., second electrode 410). Overlying barrier 408 is conductor or signal line material 410. In this example, conductor or signal line material 410 serves as an address line, a column line (e.g., column line 10 of FIG. 1). Conductor or signal line material 410 is patterned to be, in one embodiment, generally orthogonal to first conductor or signal line material 140 (column lines are orthogonal to row lines). Conductor or signal line material 410 is, for example, an aluminum material, such as an aluminum alloy. Methods for the introduction and patterning of barrier 408 and conductor or signal line material 410 include techniques known to those skilled in the art.

Figure 21:
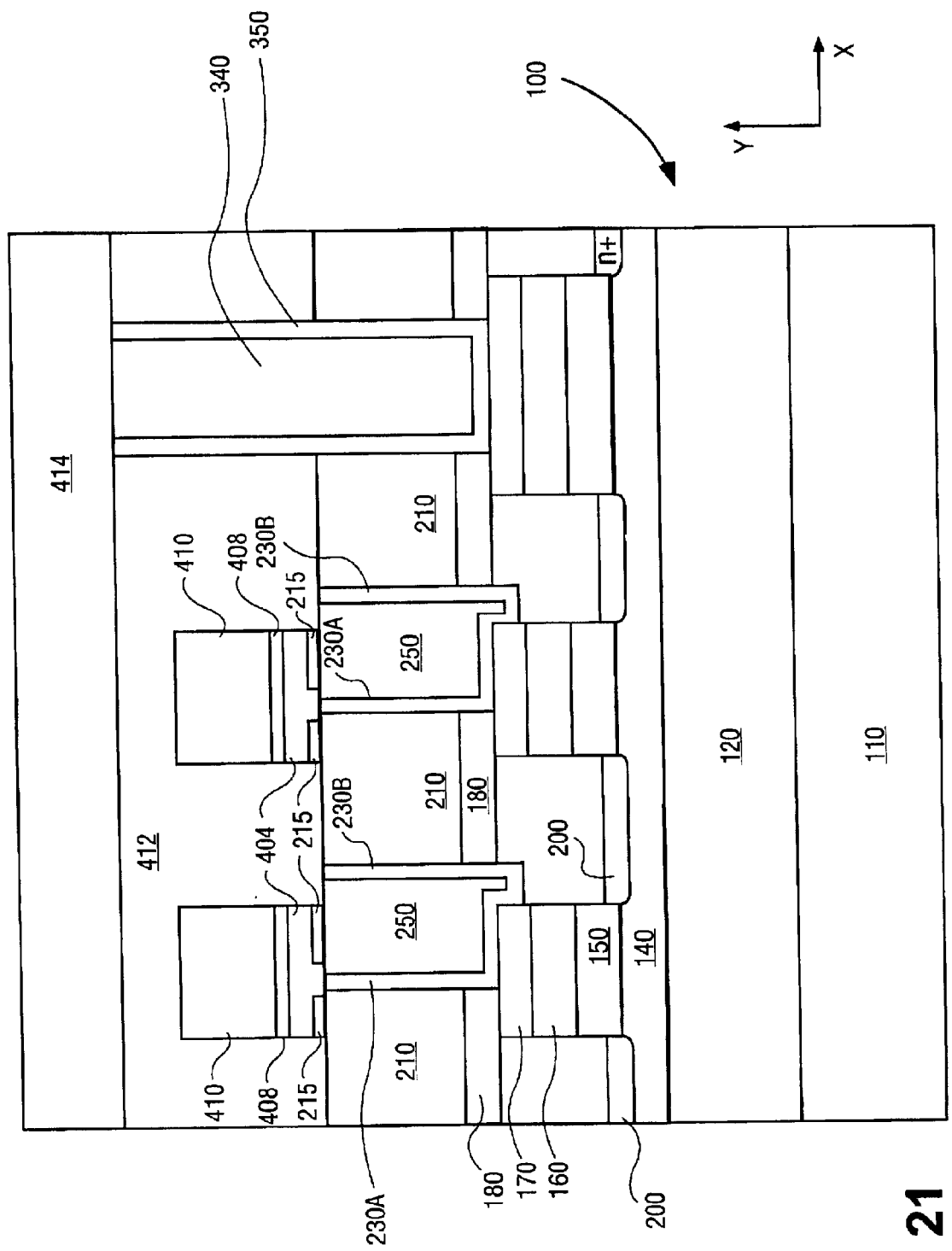
FIG. 21 depicts the structure of FIG. 20, through the same cross-sectional view, after the formation of a dielectric on the conductor, the formation of a via, and the formation of a signal line on the dielectric.

FIG. 21 shows the structure of FIG. 20 after forming dielectric material 412 on conductor 410. Dielectric material 412 is, for example, $SiO_2$ or other suitable material that is formed on conductor 410 to electronically isolate conductor 410. Following the formation, dielectric material 412 is planarized and Via 340 is formed in a portion of the structure through dielectric material 412, dielectric material 210, and dielectric material 180 to contact 170. Via 340 is filled with conductive material such as tungsten (W) and barrier material 350 such as a combination of titanium (Ti) and titanium nitride (TiN). Techniques for introducing dielectric material 412, forming and filling conductive vias, and planarizing are known to those skilled in the art. The structure shown in FIG. 21 also shows additional conductor or signal line material 414 formed and patterned to mirror that of conductor or signal line material 140 (e.g., row line) formed on substrate 100. Mirror conductor line material 414 mirrors conductor or signal line material 140 and is coupled to conductor or signal line material 140 through the conductive via. By mirroring a doped semiconductor such as N-type silicon, mirror conductor line material 414 serves, in one aspect, to reduce the resistance of conductor or signal line material 140 in a memory array, such as memory array 5 illustrated in FIG. 1. A suitable material for mirror conductor line material 414 includes an aluminum material, such as an aluminum alloy.

Figure 22:
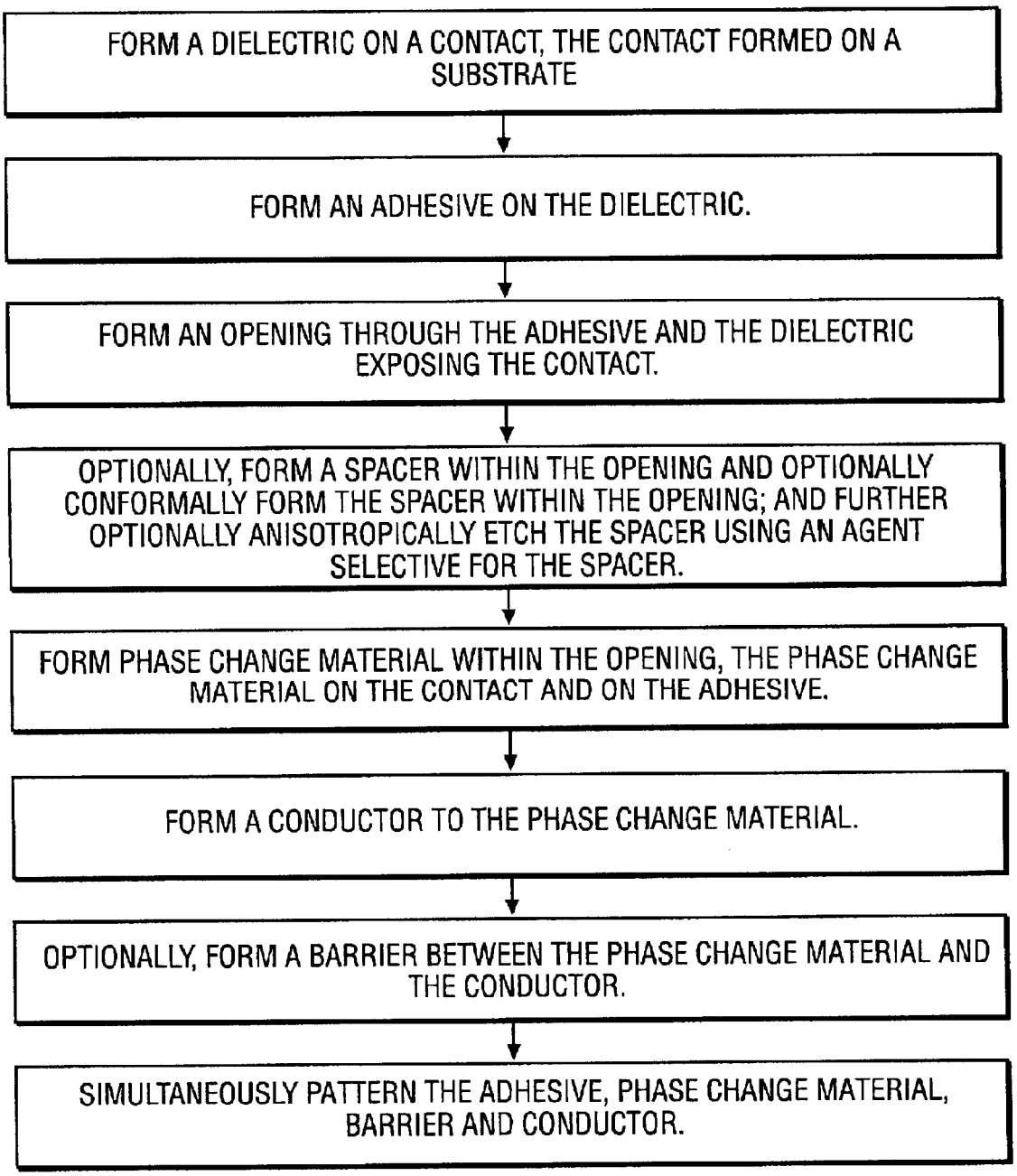
FIG. 22 depicts one method of forming a memory device having a structure similar to that described by FIG. 15.
Figure 23:
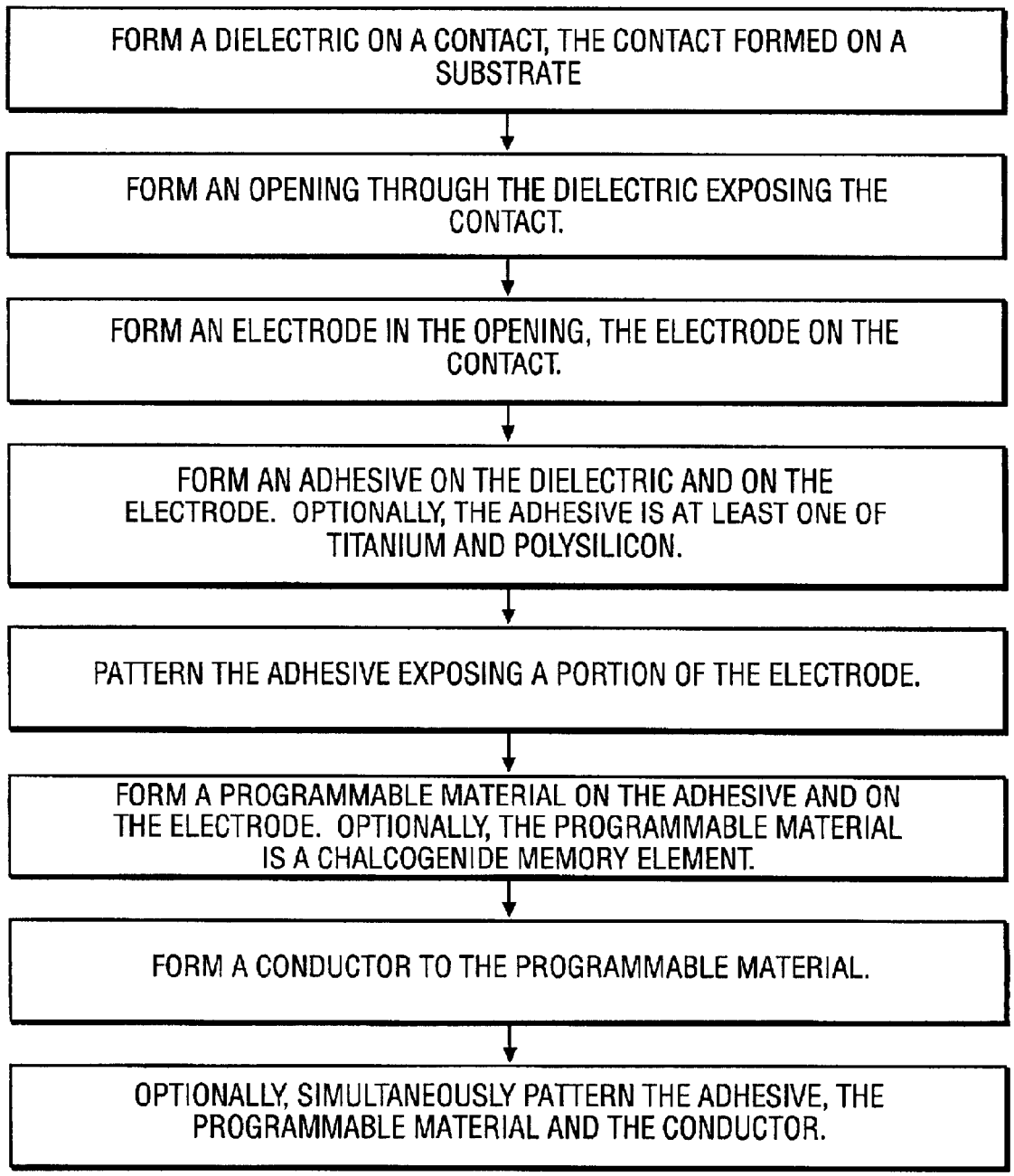
FIG. 23 depicts another method of forming a memory device having a structure similar to that described by FIG. 21.

FIG. 22 describes a method in forming a programmable memory device having a structure similar to that depicted in FIG. 15, in accordance with an embodiment. FIG. 23 describes a method in forming a programmable memory device, having a structure similar to that depicted in FIG. 21, in accordance with an embodiment.

Figure 24:
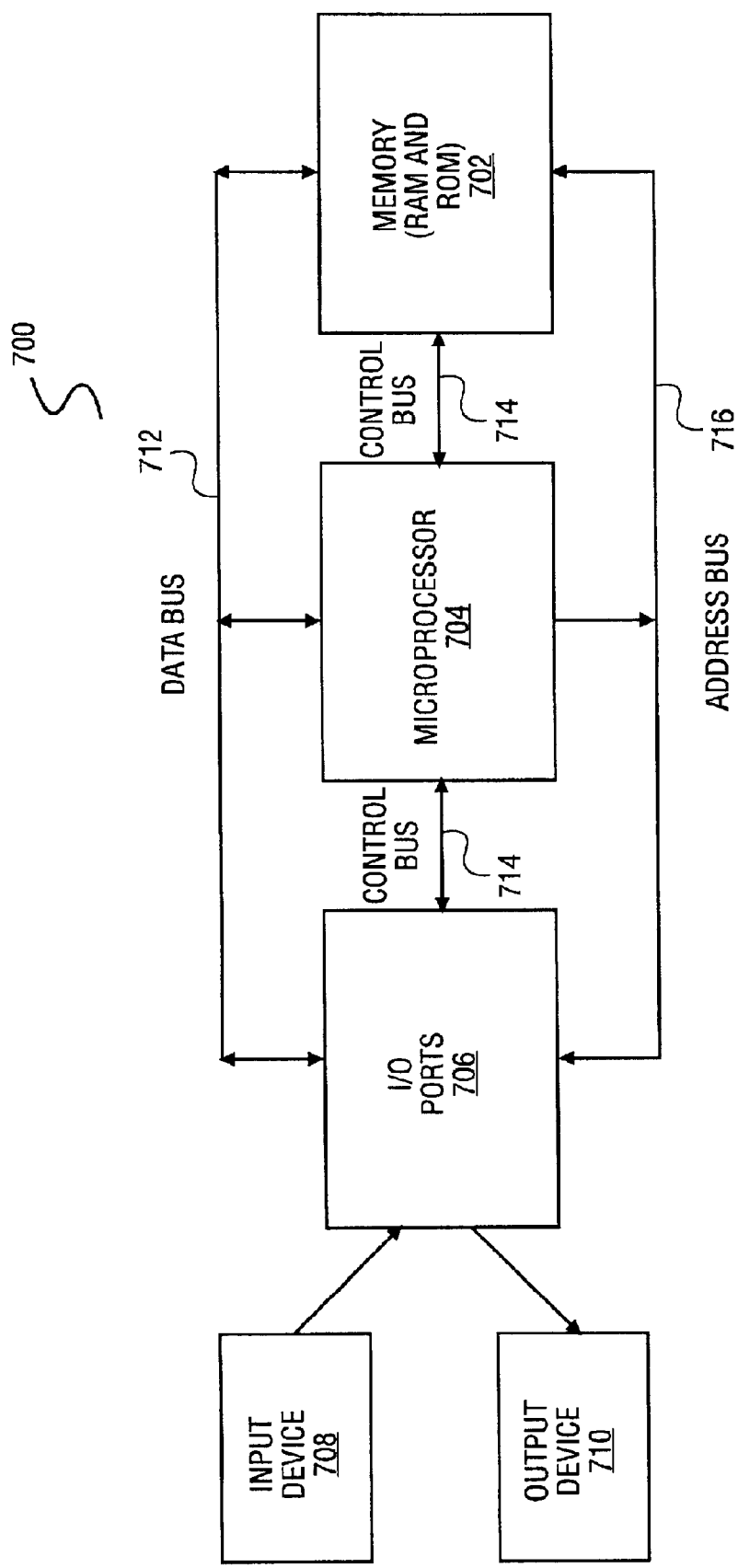
FIG. 24 depicts one system embodiment including a memory having a structure similar to that described by one of FIG. 15 and FIG. 21.

Further, as depicted in FIG. 24, a memory array such as memory device 5 (FIG. 1) wherein the individual memory cells have a structure similar to that described with reference to at least one of FIG. 15 and FIG. 21 and the accompanying text can be incorporated into a suitable system. In one embodiment, system 700 includes microprocessor 704, input/output (I/O) port 706, and memory 702. Microprocessor 704, I/0 port 706, and memory 702 are connected by data bus 712, address bus 716 and control bus 714. Microprocessor 704 fetches instructions or reads data from memory 702 by sending out an address on address bus 716 and a memory read signal on control bus 714. Memory 702 outputs the addressed instruction or data word to microprocessor 704 on data bus 712. Microprocessor 704 writes a data word to memory 702 by sending out an address on address bus 716, sending out the data word on data bus 712, and sending a memory write signal to memory 702 on control bus 714. I/O port 706 is utilized to couple to at least one of input device 708 and output device 710.

Having disclosed exemplary embodiments, modifications and variations may be made to the disclosed embodiments while remaining within the spirit and scope of the invention as defined by the appended claims.

What is claimed is:

1. A method comprising:
   forming a dielectric on a contact, the contact formed on a substrate;
   forming an adhesive on the dielectric;
   forming an opening through the adhesive and the dielectric, exposing the contact;
   forming a programmable material on the adhesive and on a first portion of the contact; and
   forming a conductor coupled to the programmable material.

2. The method of claim 1, further comprising:
   patterning the adhesive, the programmable material and the conductor simultaneously.

3. The method of claim 1, wherein forming an adhesive comprises forming at least one of titanium and polysilicon and forming a programmable material comprises forming a chalcogenide memory element.

4. The method of claim 1, further comprising forming at least one spacer on a second portion of the contact.

5. A apparatus comprising:
   a dielectric on a contact, the contact on a substrate;
   an adhesive on the dielectric, the adhesive and the dielectric having an opening exposing the contact;
   a programmable material on the adhesive and on a first portion of the contact; and
   a conductor coupled to the programmable material.

6. The apparatus of claim 5, wherein the adhesive comprises at least one of titanium and polysilicon and the programmable material comprises a chalcogenide memory element.

7. The apparatus of claim 5, further comprising at least one spacer on a second portion of the contact.

8. An apparatus, comprising:

a dielectric material;

a conductive material adjacent to the dielectric material;

an adhesive material over the dielectric material; and a memory material coupled to dielectric material via the adhesive material and directly on the conductive material.

9. The apparatus of claim 8, wherein the memory material is a phase change material.

10. The apparatus of claim 8, further comprising:

a first address line coupled to the memory material; and a second address line coupled to the conductive material.

11. The apparatus of claim 10, further comprising:

a barrier material, wherein the first address line is coupled to the memory material via the barrier material; and an isolation device, wherein the second address line is coupled to the conductive material via the isolation device.

12. The apparatus of claim 8, wherein the adhesive material comprises polysilicon.

13. The apparatus of claim 8, wherein the adhesive material comprises titanium.

14. The apparatus of claim 8, the memory material comprises a chalcogenide material.

15. The apparatus of claim 8, wherein the adhesive material is a material adapted to reduce delamination of the memory material during and after formation of the memory material.

16. The apparatus of claim 8, wherein the dielectric material is selected from the group consisting of an oxide, a nitride, or a material having a κ value less than about 1.0.

* * * * *

UNITED STATES PATENT AND TRADEMARK OFFICE
CERTIFICATE OF CORRECTION

PATENT NO. : 6,770,531 B2
DATED : August 3, 2004
INVENTOR(S) : Lowrey et al.

It is certified that error appears in the above-identified patent and that said Letters Patent is hereby corrected as shown below:

<u>Column 5,</u>
Line 64, delete "K" and insert -- $\kappa$ --.

<u>Column 10,</u>
Line 20, delete "1/0" and insert -- I/O --.

Signed and Sealed this

Fourth Day of January, 2005

JON W. DUDAS
*Director of the United States Patent and Trademark Office*